(12) United States Patent
Shino et al.

(10) Patent No.: US 6,174,779 B1
(45) Date of Patent: Jan. 16, 2001

(54) METHOD FOR MANUFACTURING A LATERAL BIPOLAR TRANSISTOR

(75) Inventors: Tomoaki Shino, Tokyo-To; Takashi Yamada, Ebina; Makoto Yoshimi, Tokyo-To; Shigeru Kawanaka; Hideaki Nii, both of Kawasaki; Kazumi Inoh, Yokohama; Tsuneaki Fuse; Sadayuki Yoshitomi, both of Tokyo-To; Mamoru Terauchi, Hiroshima, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/267,775

(22) Filed: Mar. 15, 1999

(30) Foreign Application Priority Data

| Mar. 13, 1998 | (JP) | 10-063671 |
| Mar. 16, 1998 | (JP) | 10-065904 |
| Jul. 2, 1998 | (JP) | 10-187846 |
| Dec. 22, 1998 | (JP) | 10-364451 |

(51) Int. Cl.$^7$ .................................................. H01L 21/8228
(52) U.S. Cl. ......................... 438/327; 438/204; 438/311; 438/335
(58) Field of Search ........................... 438/311, 325, 438/327, 349, 204, 335, 355; 148/DIG. 9, DIG. 96; 257/557, 558, 559, 560, 563

(56) References Cited

U.S. PATENT DOCUMENTS

| 5,376,823 | 12/1994 | Kojima et al. . |
| 5,395,775 | * 3/1995 | Bertagnolli . |
| 5,567,631 | * 10/1996 | Hsu et al. . |
| 5,580,797 | * 12/1996 | Miwa et al. . |
| 5,629,554 | 5/1997 | Maas et al. . |
| 5,846,858 | * 12/1998 | Kerber . |

FOREIGN PATENT DOCUMENTS

| 2-46735 | 2/1990 | (JP) . |
| 4-291926 | 10/1992 | (JP) . |
| 7-7012 | 1/1995 | (JP) . |

* cited by examiner

Primary Examiner—Tuan H. Nguyen
(74) Attorney, Agent, or Firm—Oblon, Spivak, McClelland, Maier & Neustadt, P.C.

(57) ABSTRACT

In a lateral bipolar transistor, its emitter region, base region, link base region, and so forth, are made in self alignment with side walls of masks by using partly overlapping two mask patterns. Therefore, not relying on the mask alignment accuracy, these regions are made in a precisely controlled positional relation. Thus, the lateral bipolar transistor, thus obtained, is reduced in parasitic resistance of the base and parasitic junction capacitance between the emitter and the base, and alleviated in variance of characteristics caused by fluctuation of the length of a link base region, length of the emitter-base junction and relative positions of the emitter and the collector, and can be manufactured with a high reproducibility.

9 Claims, 30 Drawing Sheets

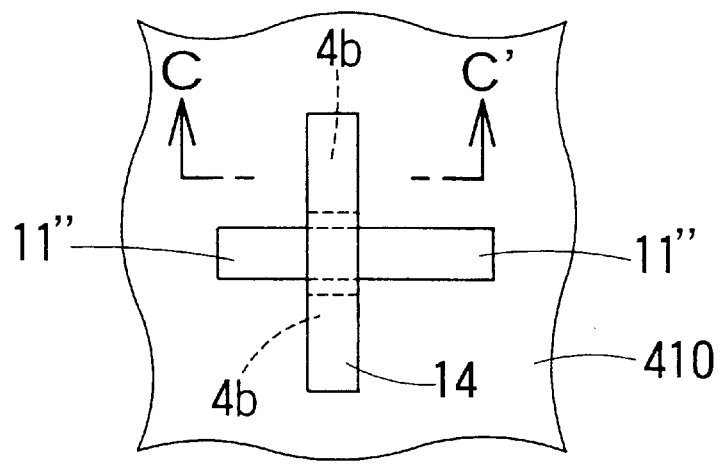
(a)
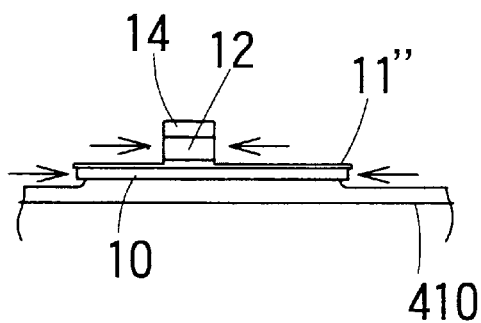
(b)
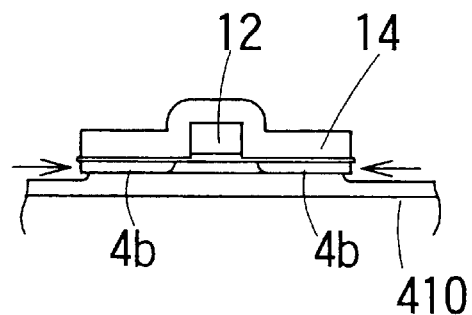
(c)
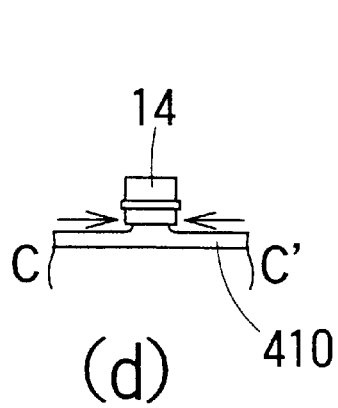
(d)
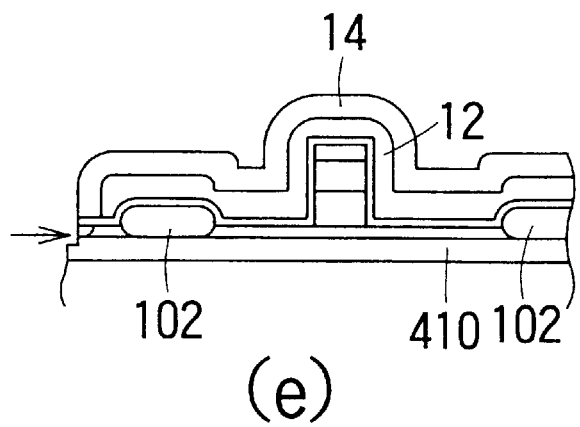
(e)
FIG. 8

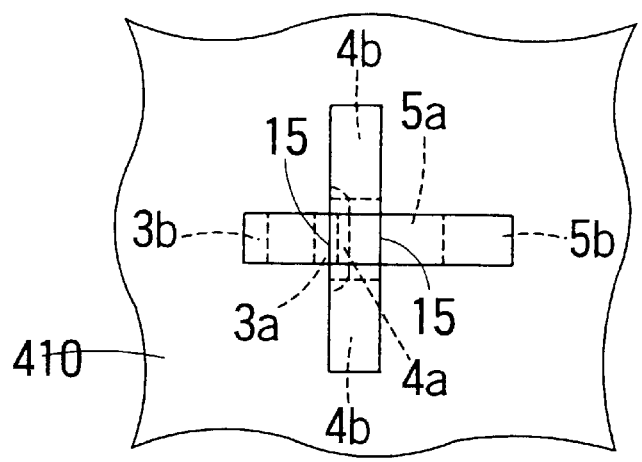
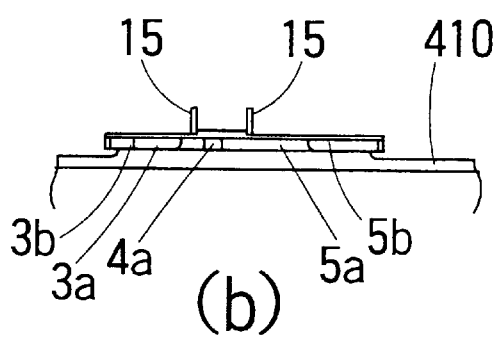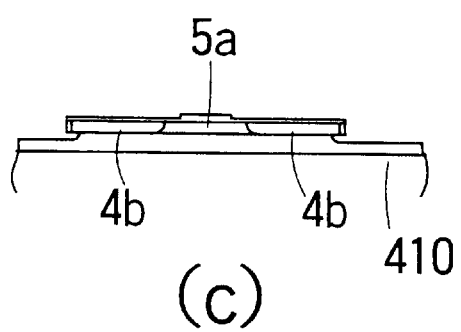
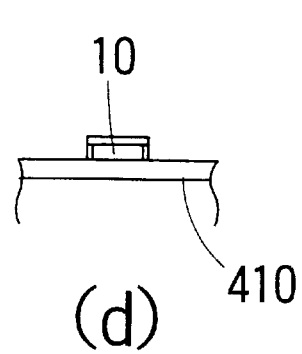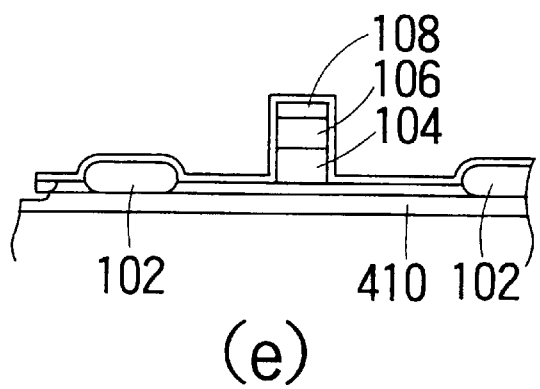
FIG. 12

METHOD FOR MANUFACTURING A LATERAL BIPOLAR TRANSISTOR

BACKGROUND OF THE INVENTION

This invention relates to a lateral bipolar transistor and its manufacturing method. More particularly, the invention relates to a lateral bipolar transistor made in a semiconductor layer on an insulating film and can decrease the parasitic base resistance, and a method for manufacturing same.

For improving RF basic characteristics of a bipolar transistor, such as cut-off frequency (also called gain-bandwidth product) ($f_T$) and maximum oscillation frequency ($f_{max}$), it is effective to decrease parasitic capacitance between electrodes. When a lateral bipolar transistor is made on a SOI (silicon on insulator) substrate, the capacitance between electrodes is reduced remarkably as compared with a bipolar transistor made on a bulk substrate, and a high-performance bipolar transistor is realized.

Japanese Patent Laid-Open Publication No. H4-29126 may be the first literature disclosing a structure and a manufacturing method of a conventional lateral bipolar transistor. FIG. 36 is a plan view schematically showing construction of a central part of the bipolar transistor. Here is shown the part of a semiconductor layer of the lateral bipolar transistor made on an insulating layer. The lateral bipolar transistor 200 has a cross-shaped semiconductor layer, and a pn junction between an $n^+$-type emitter region and a p-type base region is made in a region 204 near the center of the cross. The $n^+$-type emitter region extends to the left on the drawing sheet, and joins an $n^+$-type external emitter region 202. The p-type base region extends both upward and downward on the drawing sheet, and joins a p-type link base region 206 and a $p^+$-type external base region 208 at each end. On the opposite side of the emitter region, an $n^-$-type collector region 210 is provided. It extends to the right on the drawing sheet, and joins an $n^+$-type external collector region 212.

Used for manufacturing the transistor 200 is a method which first makes the cross-shaped semiconductor region, then makes a mask in another step, and makes the base in self alignment with side walls thereof.

However, in the transistor 200 manufactured by this method, the length of the junction between the link base region and the external emitter region 202 (the portion shown by bold lines X in FIG. 36) inevitably becomes large. Consequently, there was the problem that the parasitic pn junction capacitance increased and caused the gain to be decreased during operation under high frequencies.

Another problem was that the current gain $h_{FE}$ could not be enlarged because a lot of electrons were injected toward the link region 206. The cause was also existence of the parasitic p–n junction.

Another problem was that the length of the pn junction made in the device varied by misalignment of the resist pattern determining the region for ion implantation of the emitter impurity and caused fluctuation in the above-mentioned characteristics.

On the other band, although the width W of the link base region 206 is made relatively large, impurities cannot be implanted in self-alignment into the region, and misalignent of the resist pattern determining the region of ion implantation (of the impurity) invites fluctuation in the external base resistance (value). Fluctuation of the characteristics inevitably results in degrading the performance of the matching require circuit, the one made up of a plurality of devices chosen by the calculation that a certain output signal will be obtained in response to a certain input signal.

As discussed above, the lateral bipolar transistor having the construction shown in FIG. 36 involved the problems: large parasitic capacitance between the emitter and the base; low current gain; and difficulty in reproducible reduction of the base resistance.

Japanese Patent Laid-Open Publication No. H2-46735 is another literature disclosing a conventional lateral bipolar transistor. FIG. 37 is a plan view schematically showing a central part of the transistor disclosed in the literature.

Here again, the lateral bipolar transistor 300 has a cross-shaped semiconductor layer including a p–n junction of an $n^+$-type emitter region and a p-type base region in a central zone 304 of the semiconductor layer. Also formed are an $n^+$-type external emitter region 302, p-type link base region 306, $p^+$-type external base regions 308, $n^-$-type collector region 310 and $n^+$-type external collector region 312.

For manufacturing the transistor 300, after making a mask on the semiconductor layer and a base in self alignment with side walls of the semiconductor layer, a pattern of the external region is transferred onto the semiconductor layer.

In the transistor made the method, almost no parasitic junction is formed between the link base region 306 and the external emitter region 302, and most part of injected electrons flow toward the collector.

However, the transistor 300 shown in FIG. 37 involved the problem that reduction of the base resistance was difficult. This issue is discussed below.

The link base region 306 of the transistor 300 is made in the following process.

First made is a resist pattern having predetermined openings to determine the external emitter region 302 and the external base regions 308, and it is transfered onto the semiconductor layer. Next made are a resist pattern for implanting a $p^+$-type impurity only into the external base regions 308 and a resist pattern for implanting an $n^+$-type impurity only into the external emitter region 302. This process needs aliment of these resist patterns. Taking account of the alignment accuracy and fluctuation in size, the distance L between the external emitter region 302 and each external base region 308 can be decreased to 0.3 µm, approximately. To do so, however, the process needs a lithography apparatus and lithographic processing with an ultra-high controlability, and it is not a practical size for this process.

Another problem is high base resistance. Impurity concentration of the link base region is about $10^{18}$ cm$^{-3}$ approximately equal to that of the internal base region. The width W of the link base region 306 is approximately equal to that of the base width, nanely, 0.1 µm. Then length L of the link base region 306 is determined by the resolution limit and the alignment accuracy of the lithography which determine the distance between the external emitter region 302 and the external base region 308. That is, these factors compel the transistor 300 to accept a low impurity concentration of the link base region 306, a smaller width W thereof, and a longer length L there of to a certain extent. Therefore, the transistor 300 involved the problem that the resistance of the link base region was very high, and its inherent high-performance characteristics could not be brought out A manufacturing method for reducing the resistance of the link base region is disclosed in U.S. Pat. No. 5,629,554. As a third conventional technique, this is explained below.

The manufacturing method is configured to first form a mask on the semiconductor layer, next form external base regions by conducting photolithography, ansotropic etching and p+-type doping, and finally form an external emitter region by conducting n-type polysilicon deposition, photolithography, and anisotropic etching.

That is, according to the method, a mask is made on the semiconductor layer by first lithography, then the external base regions are made in the semiconductor layer by second lithography, and the external emitter region is made in another layer (for example, n-type polysilicon layer) other than the semiconductor layer by third lithography. By determining the distance between the external emitter region and the external emitter region by the second lithography, it becomes possible to make the gap between the external emitter region and the external base region smaller than the minimum dimensional limit by techniques relying lithography.

However, this manufacturing method also involved the problem that it needed an apparatus and a process enabling lithography with a very high accuracy, taking account of alignment accuracy and fluctuation in size, similarly to the transistor shown in FIG. 37.

Moreover, these conventional manufacturing methods involved the problem that characteristics were variable due to asymmetry of positions for making the external emitter region, external base region and external collector region. This is derived from the need for at least three kinds of resist patterns for making these three regions. For example, this results in varying the link base resistance due to misalignment between the resist pattern for the external emitter region and the resist pattern for the external base regions. Similarly, any offset of the center axis of the external collector region from the center axis of the external emitter region invites variation of the characteristics.

SUMMARY OF THE INVENTION

It is therefore an object of the invention to provide a method for manufacturing a semiconductor device, which can produce a lateral bipolar transistor remarkably improved in performance with a good reproducibility, by overcoming three problems, namely, reduction of the base parasitic resistance, reduction of the parasitic junction between the emitter and the base and alleviation of fluctuation in characteristics caused by variety in length of the external base region, length of the emitter base junction and relative misalignment between the emitter and the collector, and to provide a semiconductor device so made.

Another object of the invention is to provide a semiconductor device which prevents an increase of the current density, which may arise in the semiconductor device configured to simultaneously overcome the above three problems.

Another object of the invention is to provide a semiconductor device capable of preventing a decrease in the base-to-collector breakdown voltage which may arise in the semiconductor device configured to simultaneously overcome the above three problems.

According to the invention, there is provided a claim 1.

The invention is embodied as summarized above, and performs the effects set forth below.

By making the base region and the emitter region in self alignment with a side surface of one of two crossing masks, the invention can minimize the junction area between the link base region and the emitter region and can hence reduce the parasitic capacitance significantly.

By making the link base region along a side surface of the other of the two masks and thereafter diminishing the mask, the invention can bring the link base region closer and effectively reduce the parasitic base resistance while maintaining the breakdown voltage between the link base region and the emitter region.

The invention makes it easy to separate the external collector region and the external base region by a predetermined distance and can maintain their breakdown voltage.

Additionally, since the invention can make respective regions of the transistor in self alignment with two masks, microscopic positional relations can be accurately controlled and readily reproduced. As a result, a high-performance bipolar transistor can be reliably manufactured by using conventional manufacturing facilities.

Moreover, the invention realizes a Bi-CMOS structure incorporating a bipolar transistor and a MOS transistor by a simple process.

As explained above, the invention enables stable manufactory of a semiconductor device with a higher performance than conventional ones, and its industrial merit is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 4 through 12 are diagrams schematically illustrating different steps of a manufacturing method of a bipolar type semiconductor device shown in FIG. 1;

DETAILED DESCRIPTION OF THE PREFERRED EMBODIMENTS

According to the invention, by using substantially crossing two mask patterns, the emitter region, base region, external base regions, and so forth, of a lateral bipolar transistor can be made in self alignment with side surfaces of the masks, respectively.

Since respective regions are made in self alignment with substantially crossing two mask patterns, positional relations among respective regions can be controlled accurately, not relying on the accuracy of mask alignment. As a result, a bipolar transistor with a small parasitic capacitance and a small parasitic resistance can be manufactured with a high reproducibility.

Explained below are embodiments of the invention with reference to the drawings.

Figure 1:
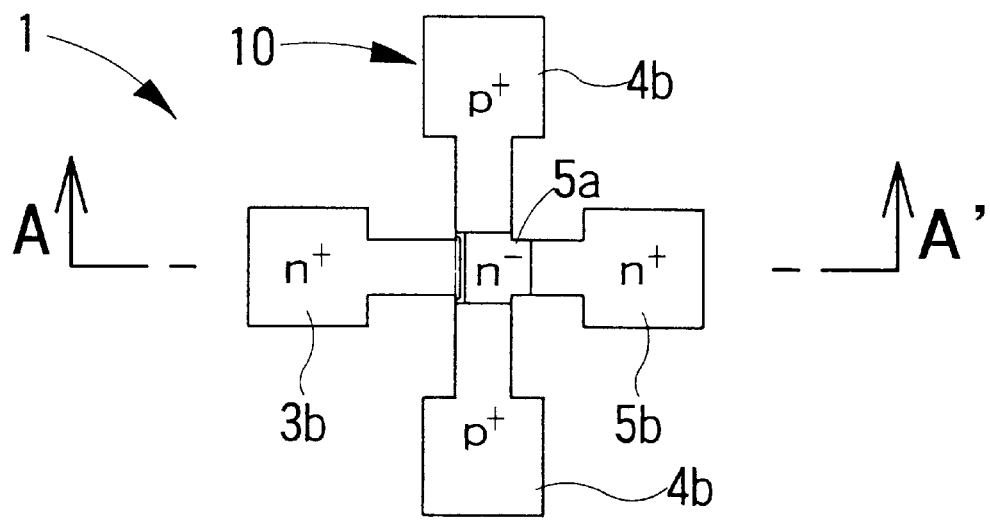
FIG. 1 is a plan view schematically showing the portion of a semiconductor layer in a lateral bipolar transistor according to the invention.
Figure 2:
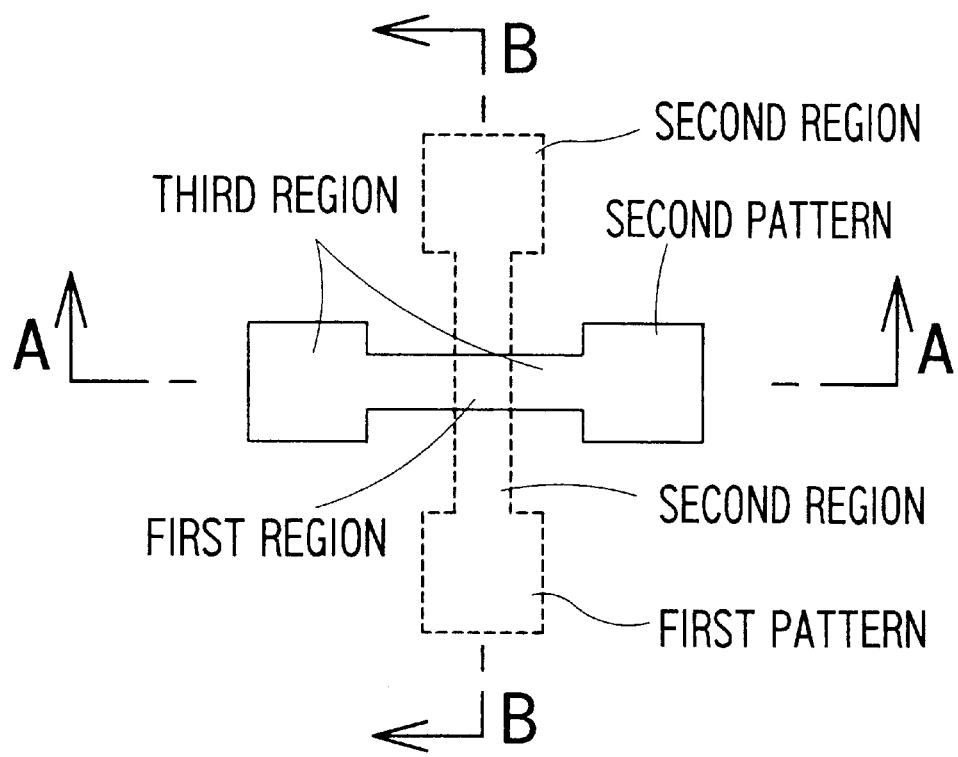
FIG. 2 is a diagram showing a mask pattern used in the present invention.
Figure 3A:
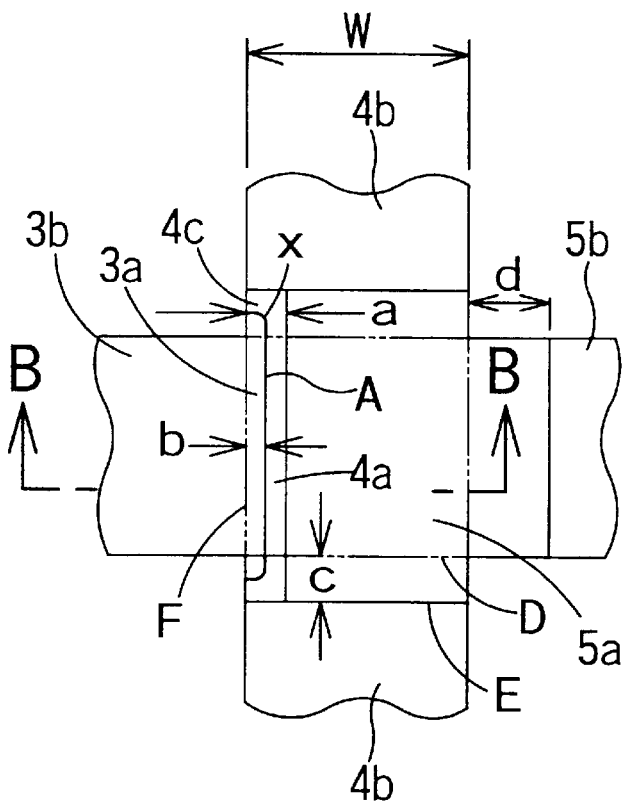
FIG. 3A is a fragmentary view showing a central part of the semiconductor layer of FIG. 1 in an enlarged scale.
Figure 3B:
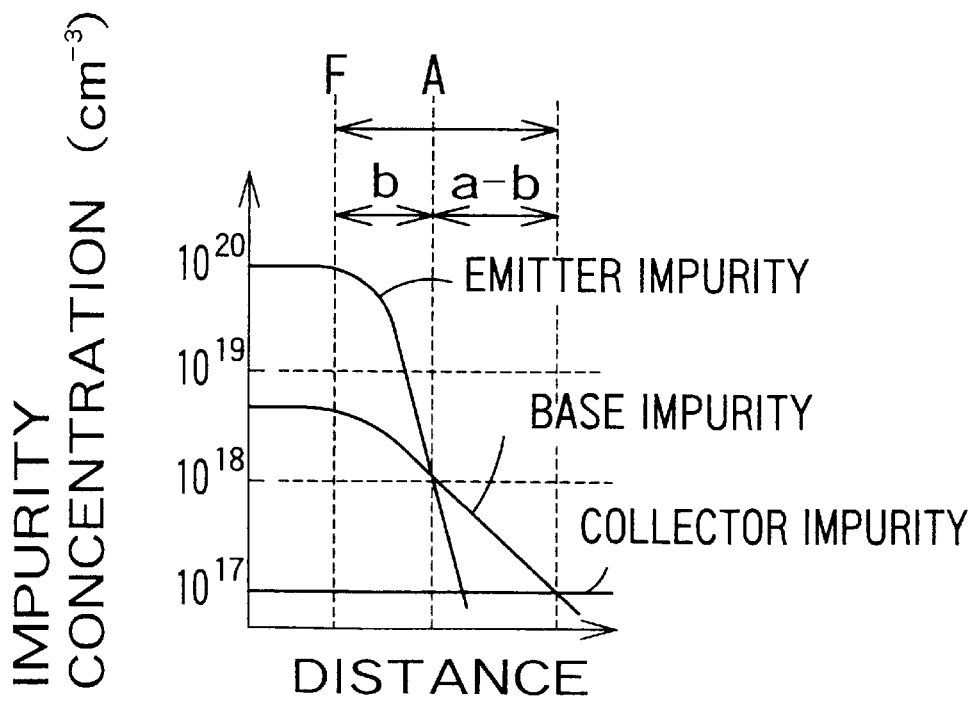
FIG. 3B is a profile diagram of the impurity concentration taken along the B—B line of FIG. 3A.

FIG. 1 is a plan view schematically showing the portion of a semiconductor layer in a lateral bipolar transistor according to the invention. FIG. 2 is a diagram showing a mask pattern used in the present invention FIG. 3A is a fragmentary view showing a central part of the semiconductor layer of FIG. 1 in an enlarged scale. FIG. 3B is a profile diagram of the impurity concentration taken along the B—B line of FIG. 3A In these drawings, an example with an npn-type structure is shown.

A transistor 1 includes an isle-shaped semiconductor layer 10 made on an insulating layer, not shown. The semiconductor layer 10 has an approximately cross-shaped pattern with projections extending in four directions, in which an external emitter region 3b, a pair of external base regions 4b, 4b, and an external collector region 5b are made, respectively. Referring to FIGS. 3A and 3B showing the central part in greater detail, a pn junction between an emitter region and a base region is formed in a left location. In the present application, the "base region" is explained as distingushing an "internal base region 4a" and "link base regions 4c".

As shown in FIG. 3A, a junction A between an emitter region 3a and the internal base region 4a is formed near the left end of the central part of the semiconductor layer 10. At both sides of the emitter/base junction A, junctions X, X between a link base region 4c and the emitter region 3a are formed, respectively. The emitter region 3a is connected to the external emitter region 3b. Adjacent to the right end of the base region 4a is a collector region 5a connected to the external collector region 5b.

The transistor 1 according to the invention having the above-explained structure is made by using a first pattern and a second pattern which are in a substantially rectangular crossing relation as shown in FIG. 2. For simplifying the explanation, the part of the semiconductor layer where the first pattern and the second pattern overlap in FIG. 2 is referred to as the "first region", the part defilned by the first pattern alone is referred to as the "second region", and the part defined by the second pattern alone is referred to as the "third region".

In the transistor 1 according to the invention, a mask for the first pattern shown in FIG. 2 is first made on the semiconductor layer, followed by injecting an impurity into its left side portion and laterally diffusing the impurity under the mask, thereby to make the internal base region 4a and the external base regions 4b. That is, by diffusing a first conduction type impurity (p-type impurity in the illustrated example) into the "first region" and the "second region" from lateral directions, it is introduced to exhibit a s hap concentration profile. FIG. 3A shows at a the lateral distance from the side surface (F in FIG. 3A) of the "first region" to the surface where the concentration of the first conduction type impurity introduced by lateral diffusion becomes equal to the concentration of a second conduction type impurity contained in the collector region 5a. The distance a corresponds to the width of the link base region 4c, which is typically 2000 Å approximately.

In the present invention, the second conduction type impurity (n-type impurity in the illustrated example) forming the emitter region 3a is also diffused laterally from the left side of the first pattern shown in FIG. 2. that is, using the first pattern shown in FIG. 2 as a mask, the impurity is injected in its left portion, and then heated to have the impurity laterally diffused under the mask. Although the first conduction type impurity is also diffused under the mask as explained above, the emitter region 3a can be made by increasing the concentration of the second conduction type impurity. FIG. 3B shows a profile of the impurity concentration distribution along the B—B line of FIG. 3A. As noted from FIG. 3A, the impurity concentration of the emitter region 3a typically has the peak concentration as large as $10^{21}$ cm$^{-3}$ or more. FIG. 3B also shows at b the distance from the above-mentioned side surface (F in FIG. 3A) to a plane where the concentration of the second conduction type impurity becomes equal to the concentration of the first conduction type impurity. The distance b is typically a value about 1000 Å.

When the diffusion coefficent of the first conduction type impurity forming the base is set larger than the diffusion coefficient of the second conduction type impurity forming the emitter, the diffusion length of the emitter impurity becomes smaller than the diffusion distance of the base impurity, and it results in the profile shown here. For example, by using boron (B) as the base impurity and arsenic (As) as the emitter impurity, the internal base region 4a and the emitter region 3a can be regulated in width because boron has a larger diffusion coefficient Alternatively, the base impurity may be diffused under a higher temperature, and/or for a longer time than those for the emitter impurity.

The internal base region 4a is a part of the "first region" excluding the emitter region from the first conduction impurity diffusion layer, and its width is expressed as (a–b). The impurity concentration on the plane where the emitter impurity equals the base impurity, that is, the emitter-base junction, is typically on the order of $10^{18}$ cm$^{-3}$.

As explained above, according to the invention, since the internal base region 4a and the emitter region 3a are made to match the side sur face of the "first region" by using the first pattern of FIG. 2, the length of the parasitic junction X between each link base region 4c and the emitter region 3a shown in FIG. 3A can be made much smaller than the length of the intrinsic junction A. As a result, the parasitic capacitance of the emitter-base junction can be reduced remarkably. This is an effect that the conventional transistor shown in FIG. 36 cannot attain.

The transistor according to the invention has the external base regions 4b of the first conduction type in the "second region", apart from the "first region" by a distance C as shown in FIG. 3A. The distance C is from the boundary (D in FIG. 3A) between the "first region" and the "second region" to the plane where the first conduction type impurity concentration of the external base regions 4b equals the second conduction type impurity concentration of the collector region 5a, and corresponds to the length of the link base region 4c. According to the invention, the external base regions 4b are made in self alignment by using the second pattern shown in FIG. 2. More specifically, by making a mask in form of the second pattern, then making a spacer on side walls of the mask, and implanting impurity ions of the first conduction type, the external base regions 4b can be made in the locations distant by C. In this case, by adjusting the width of the spacer on the side walls, the distance C can be adjusted to an optimum value.

Alternatively of the method using the side wall spacer, it is possible to make a mask larger than the second pattern by a predetermined amount, then inject first conduction type impurity ions, thereafter diminish the mask by etching, for example, and then pattern the semiconductor layer. In this case, the distance C can be controlled by the mask size. Alternatively, it is also possible to stack a mask material larger than the second pattern, then introduce the base impurity, thereafter make the lower mask material retract by side etching to the size of the second pattern, then remove the mask material and pattern the semiconductor layer.

In any case, the patterning of the semiconductor layer 10 is conducted by using both the first pattern and the second pattern shown in FIG. 2. That is, the semiconductor layer is patterned by using both the first pattern and the second pattern as a mask.

Figure 37:
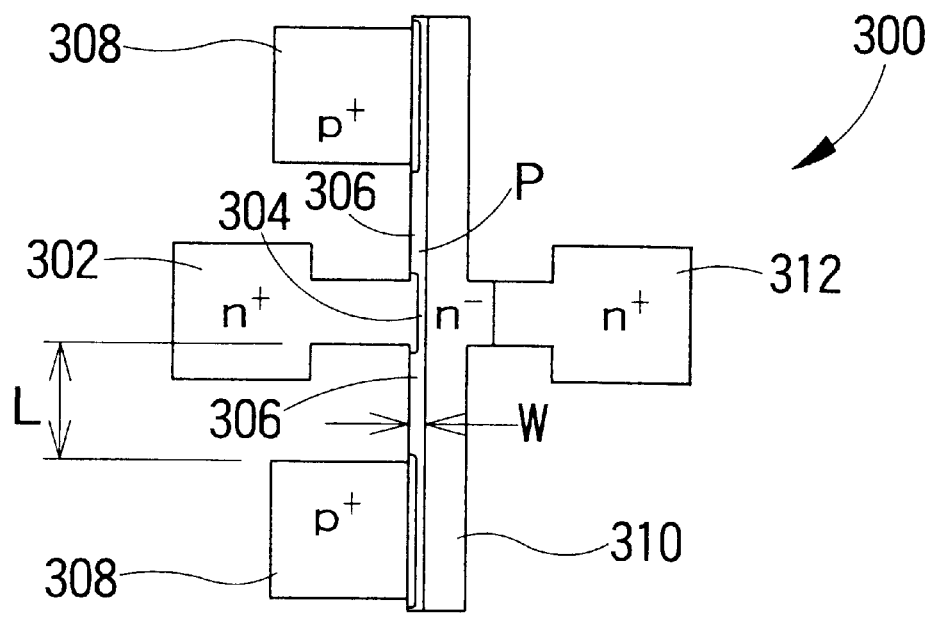
FIG. 37 is a plan view schematically showing construction of a central part of a conventional lateral bipolar transistor.

The boundaries (D in FIG. 3A) between the "first region" and the "second region" also determine end positions of the emitter region 3a. That is, in the present invention, since the external base regions 4b are connected to align with the boundaries, the length C of each link region 4c can be decreased absolutely regardless of the mask alignment accuracy. For example, by providing the side spacer on side surfaces of the mask of the second pattern as explained above, or by side etching of the mask material, the length C can be readily reduced to 0.1 μm, approximately. As a result, the parasitic base resistance can be reduced much more than conventional techniques. Further, on the theoretical level, the length C of the link base region can be made zero. These effects are not obtained by the conventional transistor shown in FIG. 37. That is, according to the invention, even as compared with the third conventional technique discussed above, the parasitic resistance and the parasitic emitter-base capacitance can be reduced more.

The external base regions 4b made in this manner have a width defined by reference symbol W in FIG. 3A near the connection to the link base region 4c. Since this width is oriented to perpendicularly cross the orientation of the base current, the parasitic base resistance can be effectively reduced further by increasing the width.

In a more preferable version, the external base region 4b has a higher-concentrated first conduction type impurity than the internal base region 4a. As a result, the parasitic base resistance can be reduced more remarkably.

Moreover, the invention connects the external emitter region, pair of external base regions and external collector region in self alignment by using mutually crossing two mask patterns as explained above. That is, by determining the configuration of the semiconductor layer through lithography in twice, regions for diffusing impurities can be made in self alignment Therefore, a transistor with less variance in characteristics can be realized.

Especially in the third conventional technique discussed above involved the problem: the base resistance being variable due to misalignment of patterns for the external emitter region and the external base regions. In contrast, according to the invention, the length C of the link base region 4c can be controlled by adjusting the width of the side wall spacer formed on side surfaces of the second pattern or the dimensional difference between the resist pattern and the mask material, and it is very easy to alleviate variance of the base resistance.

Additionally, according to the invention, it is easy to control and suppress variance of the length X of the parasitic junction between the link base region 4c and the emitter region 3a by laterally diffusing the emitter impurity.

Next explained is a method for manufacturing a bipolar type semiconductor device having the above-explained structure.

FIGS. 4 through 14 are diagrams schematically illustrating different steps of the manufacturing method of the bipolar type semiconductor device shown in FIG. 1. Among these drawings, views with drawing numbers accompanying (a) are plan views of the bipolar type semiconductor device under different steps, views having drawing numbers accompanying (b) through (d) are cross-sectional views taken along the A–A' line, B–B' line and C–C' line in the views accompanying (a), and views having drawing numbers accompanying (e) are cross-sectional views taken along the lengthwise direction of the gate in a MOS transistor portion when a Bi-CMOS (bipolar CMOS) structure is made. The views with drawing numbers accompanying (d) are only shown in FIGS. 8 through 14.

Figure 4:
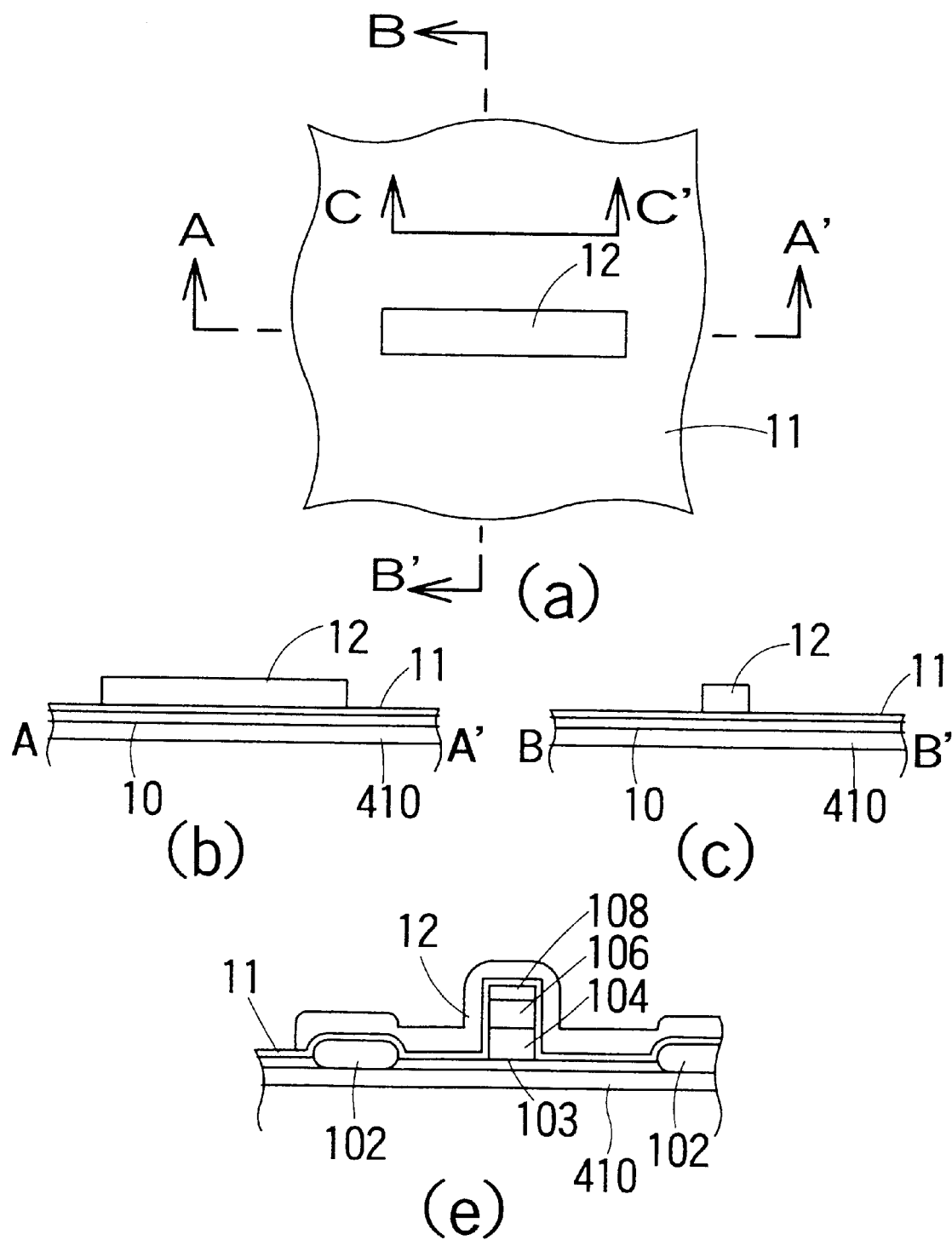

The method shown here first makes a first mask on a SOI substrate as shown in FIGS. 4. More specifically, first made on the SOI substrate are elements up to the gate electrode of the MOS transistor. The SOI substrate is made by stacking a predetermined thickness of a single-crystal silicon layer 10 as a semiconductor thin film on an insulating base plate 410, and may be any of various products such as SIMOX substrates and Unibond substrate supplied from substrate manufacturers. Using such a substrate, after making the MOS gate electrode in any of various methods, a process for manufacturing the bipolar transistor is started.

First added to the silicon layer 10 is a predetermined amount of an n-type impurity such as phosphorus (P) or arsenic (As). Then, the semi-product is annealed to form a low-concentrated n-type impurity region which will be processed later into the n$^-$-type collector region 5a After that, a stopper film 11 is made on the n-type impurity region, and a first mask 12 of a predetermined configuration, such as a laterally elongated rectangle, is made via the stopper film 11. Polycrystalline silicon, for example, can be used as the material of the first mask 12, and a film stacking three layers, a thin silicon oxide film, thin silicon nitride film and thin silicon oxide film, for example, can be used as the material of the stopper film 11. Since the etching rate of the polycrystalline silicon is few ten times higher than the etching rate of the silicon oxide film, processing of the first mask 12 can be stopped at the uppermost thin silicon oxide layer of the stopper film 11.

Figure 5:
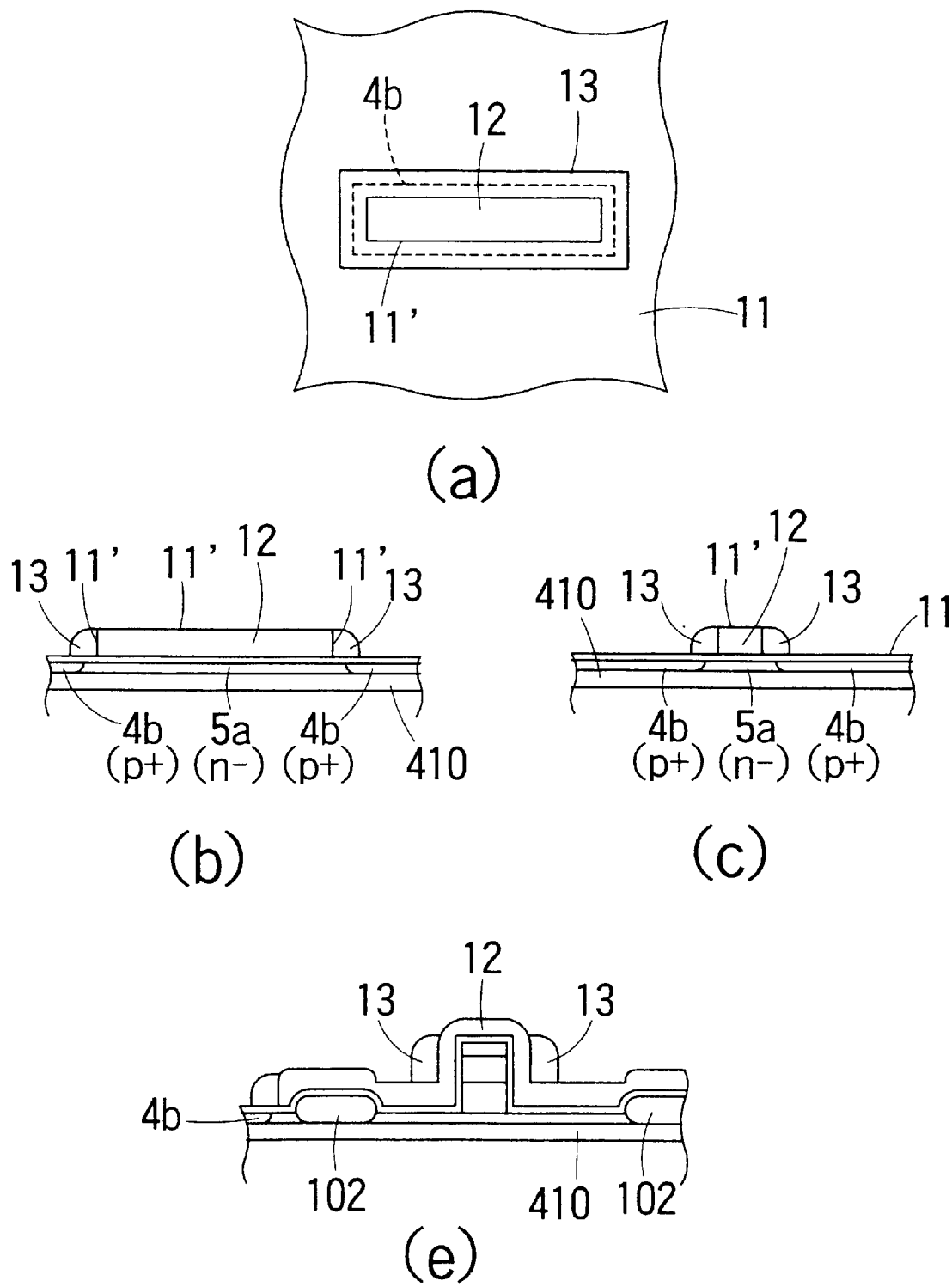

Next as shown in FIG. 5, side walls are made on the first mask. In greater detail, a side wall film 13 is made on side surfaces of the first mask, and ions are implanted by using at least the first mask 12 and the side wall film 13 as a mask. For example, adding a predetermined amount of a p-type impurity such as boron (B), and annealing is conducted, if necessary, so as to make p$^+$-type diffusion layers, which will be processed into the p$^+$-type external base regions 4b, in self alignment with the first mask 12, i.e., the laterally elongated rectangular pattern. With this method, depending upon the thickness of the side wall film 13 and conditions of the annealing step, the p$^+$-type diffusion layers as the p$^+$-type external base regions can be made in predetermined locations in self alignment with the first mask 12.

Preferably used as the material of the side wall film 13 is polycrystalline silicon which can be processed with a high selectivity relative to the stopper film 11. In this case, however, when polycrystalline silicon is used as the first mask 12, if a thin oxide film is stacked on the entire wafer surface to make a stopper film 11' and to sandwich it between these polycrystalline silicon layers as illustrated, the disappearance of the first mask 12 by over-etching can be prevented during anisotropic etching for making the side wall film 13.

Figure 6:
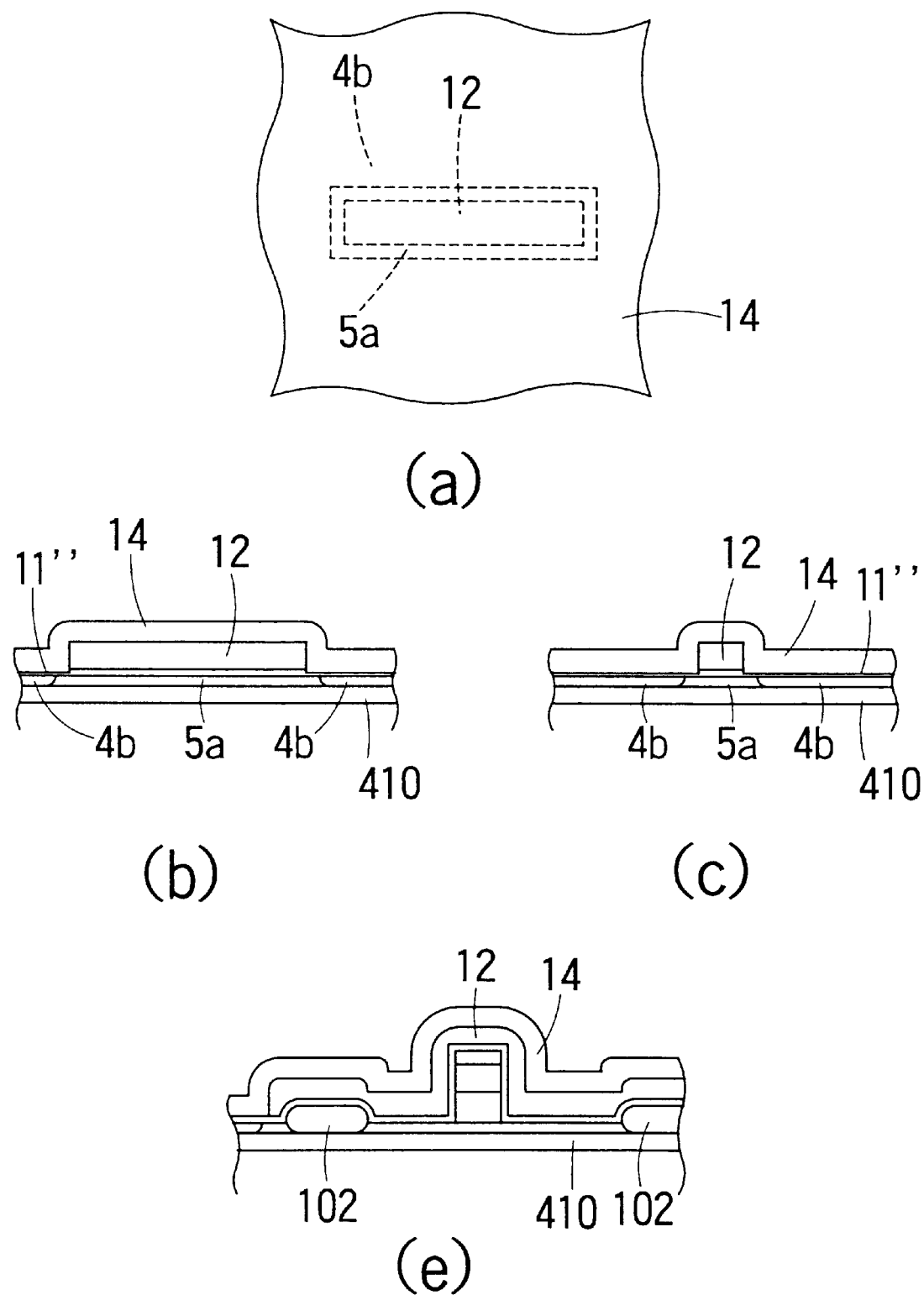

Next as shown in FIG. 6, a mask material as the second mask is stacked. In greater detail, after removing the side wall film 3 by isotropic etching by using the stopper film 11' as a stopper, the stopper film 11' is removed. The step of removing the stopper film 11' is not indispensable. However, when a non-insulating film such as polycrystalline silicon is used as the first mask 12 like this embodiment, the first mask 12 must be finally separated to ensure stable operation of the transistor. In this embodiment which needs removal of the first mask 12, the stopper film 11' is preferably removed here to facilitate separation of the first mask 12 in a later step. In the case like the current embodiment where the stopper film 11' is made of silicon oxide, the stopper film 11' can be removed by a nearly infinite high selection ratio by using HF liquid or NH$_4$F liquid, for example, due to the underlying polycrystal line silicon film as the mask 12 and a stopper film 11" tinned by removing only the uppermost thin oxide film among the thin oxide film, thin nitride film and thin oxide film forming the stopper film 11.

After that, a film 14 used as a second mask is stacked on the entire wafer surface. Preferably used as the second mask material is appropriate one enabling selective anisotropic etching of the first mask material, and a silicon nitride film, for example, is an appropriate material.

Figure 7:
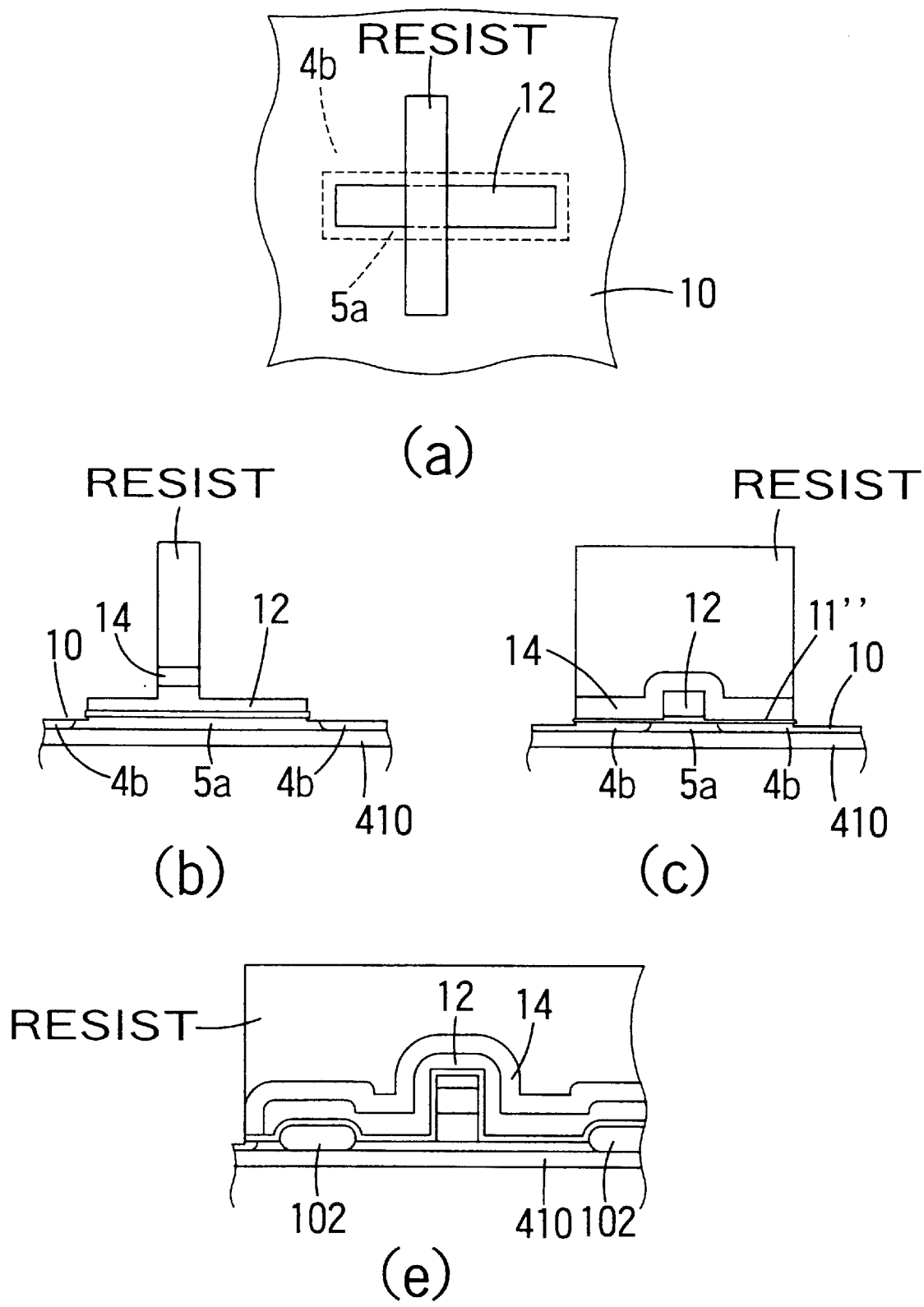

Next as shown in FIG. 7, the second mask is patterned. More specifically, a longitudinally elongated rectangular resist mask is made, and it is patterned to form a mask 14. In this case, the first mask 12 and the exposed semiconductor thin film 10 are partly removed by over-etching, but it is immaterial as long as they are not removed entirely. In this manner, the first mask 12 having a laterally elongated rectangular pattern and the second mask 14 having a longitudinally elongated rectangular pattern are made to cross each other.

Next as shown in FIG. 8, the silicon layer 10 is patterned. More specifically, using the first mask 12 and the second mask 14 as a mask, the semiconductor thin film 10 is selectively removed by etching to make the semiconductor thin film 10 having an approximately cross-shaped pattern. In the current embodiment using polycrystalline silicon as the material of the first mask 12, it may occur that the first mask 12 is removed and disappears by etching at substantially the same etching speed during etching of single crystal silicon as the semiconductor thin film 10. However, the underlying stopper film 11" behaves as a stopper, and prevents etching of the semiconductor film thereunder.

Also, in this step, the p$^+$-type external base regions 4b previously made in self alignment with the laterally elongated rectangular by the first mask 12 and the side wall film 13 are patterned so that they be partly cut out and ideally remain only in the longitudinally elongated rectangular pattern. After that, the method includes a step of removing damages by anisotropic etching, in which the damaged semiconductor thin-film layer 10 is laterally etched to configure the semiconductor thin film 10 to retract as shown by arrows in FIG. 8. In this case, an etching step for intentionally make it retreat may be added to prevent that the impurity is injected diagonally relative to the side surfaces mainly of the longitudinally elongated pattern portion of the semiconductor thin film 10 during later ion implantation of the ptype base region 4a and the n$^+$-type emitter region 3a, for example.

Figure 9:
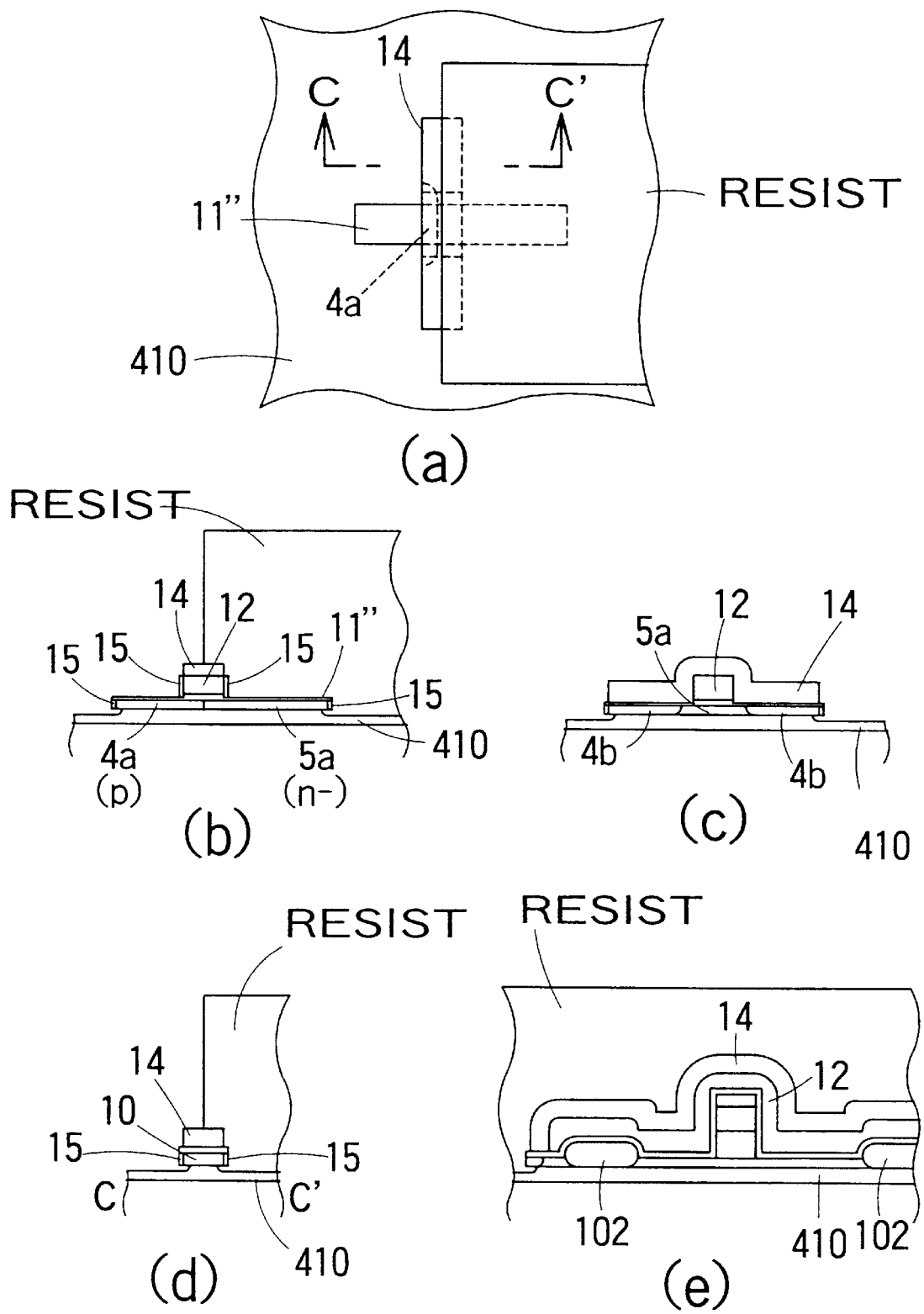

Next as shown in FIG. 9, a p-type region is made. More specifically, using the second mask 14 and a resist as a mask, a p-type impurity such as boron (B) is introduced by ion implantation, for example, into a part of the laterally elongated rectangular pattern of the semiconductor tin film 10, and it is laterally diffused by an annealing step. As a result, the p-type diffusion layer as the p-type base region 4a is made under the second mask 14. If indium is used as the p-type impurity, because of its large atomic weight, the transverse profile just after ion implantation becomes sharp, and a transistor with a narrow base width can be made.

Then, by adjusting the thickness of the side wall film 13 and conditions of the annealing step, the external base regions 4b can be connected directly to the base region 4a. In this case, the distance between the external base region 4b and the emitter region 3a is smaller than the base width. As a result, the base resistance can be remarkably reduced, and the high-frequency characteristics of the transistor can be improved significantly.

However, if the p-type base region 4a and the p$^+$-type external base regions 4b are brought into direct contact, the width (in the longitudinal direction) of the neutral region in the n$^-$-type collector region 5a becomes narrower by depletion layers extending from the p$^+$-type external base regions 4b into the n$^-$type collector region 5a, and the path of carriers from the emitter through the base to the collector is narrowed especially when the laterally elongated rectangular pattern has a narrow width. It may invite the problems that the carrier transfer efficiency deteriorates due to the carriers being drawn into the base and that the gradient of carrier density is lowered due to an increase of the current density. That is, in the practical level, an optimum value must exist for the positional relation between the p$^+$-type external base regions 4b and the laterally elongated rectangular pattern, also taking the width of the laterally elongated rectangular pattern into consideration. In certain cases, therefore, it may be undesirable to directly connect the p$^+$-type base regions 4b to the p-type base region 4a.

Figure 13:
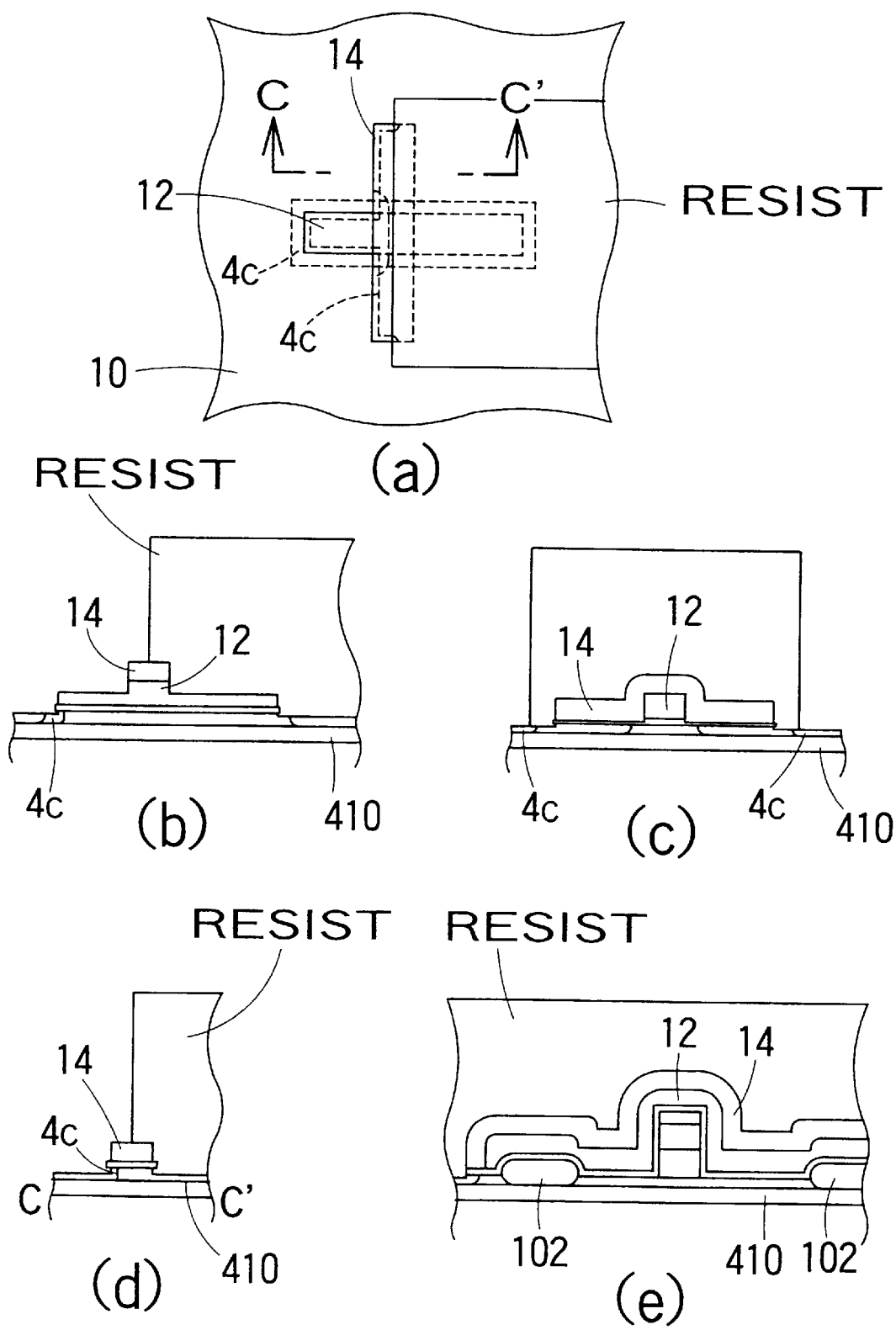
FIG. 13 is a diagram schematically illustrating an alternative step in the manufacturing method shown in FIGS. 4 trough 12.

In such cases, after the mask shown in FIG. 7 is made, a p-type impurity such as boron (B) may be ion-implanted previously so as to make an inclination, where necessary, to make the p-type base link region 4c as shown in FIG. 13. Thus, it is prevented that the p$^+$-type external base regions 4b, formed later, are offset from the p-type base region 4a.

Figure 10:
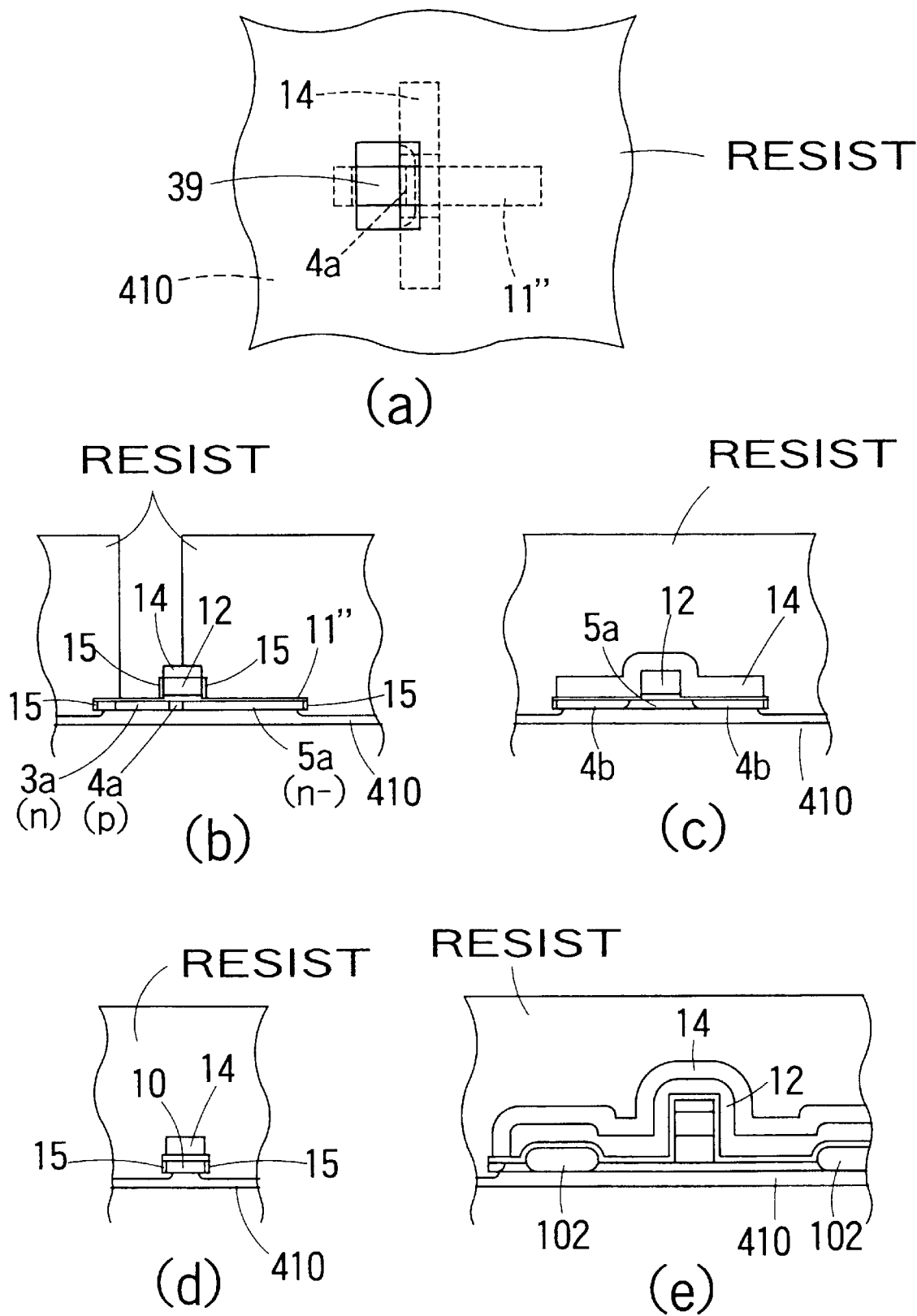

Next as shown in FIG. 10, the emitter region is made. More specifically, using the second mask 14 and a resist as a mask, an n-type impurity such as phosphorus (P) or arsenic (As) is introduced by ion implantation into the laterally elongated rectangular portion of the semiconductor thin film 10 to form the n$^+$-type emitter region 3a, by adding an annealing step, if necessary. Since f$_T$ is remarkably improved when a high-concentrated sharp profile is made in the emitter, it is desirable to use arsenic having a large atomic weight and a small diffusion coefficient Prior to this, as shown in FIG. 9, a protective film 15 is preferably formed by making a thin side wall oxide film on exposed side walls of single-crystal silicon as the semiconductor thin film 10 and polycrystalline silicon as the first mask 12 by an oxidization step. Because of the retraction of these layers shown in FIG. 8 and the presence of the protective film 15, ions entering slightly diagonally during ion implantation of the n-type impurity can be shut out, and direct introduction of the impurity into the longitudinally elongated rectangular portion of the semiconductor thin film 10 can be prevented Although it is also possible to use a resist pattern with an opening like the step of making the p-type base region 4a shown in FIG. 9, the step of FIG. 10 limits the ion implanting region narrower. Its reason is as follows. That is, for ion implantation for the n$^+$-type emitter region 3a, although this is the case also for the p-type base region 4a, it is important to make a uniform impurity profile in the depth direction of the semiconductor thin film 10 to ensure uniform bipolar operation throughout the entire thickness. Additionally, if a neutral p-type region remains at the bottom of the SOI layer, the parasitic emitter-base junction area increases significantly, and it results in serious deterioration of the performance such as current gain and f$_T$. Therefore, it is necessary to select conditions for ion implantation which brings the impurity also to a deep region of the film. That is, the impurity must be injected with a higher acceleration energy than normal one. In this case, however, especially when As with a large atomic weight is ion-implanted, the film in the ion-implanted region may be possibly disordered in crystal structure and changed into an amorphous phase throughout the full depth thereof by ion implantation of the n$^+$-type emitter region 3a. If re-crystallization does not take place sufficiently from the single-crystal silicon layer, i.e. the semiconductor thin film 10, as the core, in the laterally adjacent regions without ion implantation in a later thermal step, then it results in a change to a polycrystalline form, and in causing the problem that the resistance of the emitter diffusion layer increases to the order of one digit. This inevitably causes significant deterioration of the high-frequency performance of the bipolar transistor.

In contrast, the embodiment, configured to regulate the ion injected region for the n$^+$-type emitter region 3a as precisely as possible, can narrow down the high-resistance semiconductor region and recrystallize it from opposite sides to ensure sufficient and easy crystallization to a single crystal and hence prevent an increase of the resistance. Further, also in the step of making the p-type base region, if the region is restricted as far as possible, it is possible to prevent a neutral ptype region at the bottom of the external emitter region, which is made later, and to decrease the resistance of the external emitter.

Figure 11:
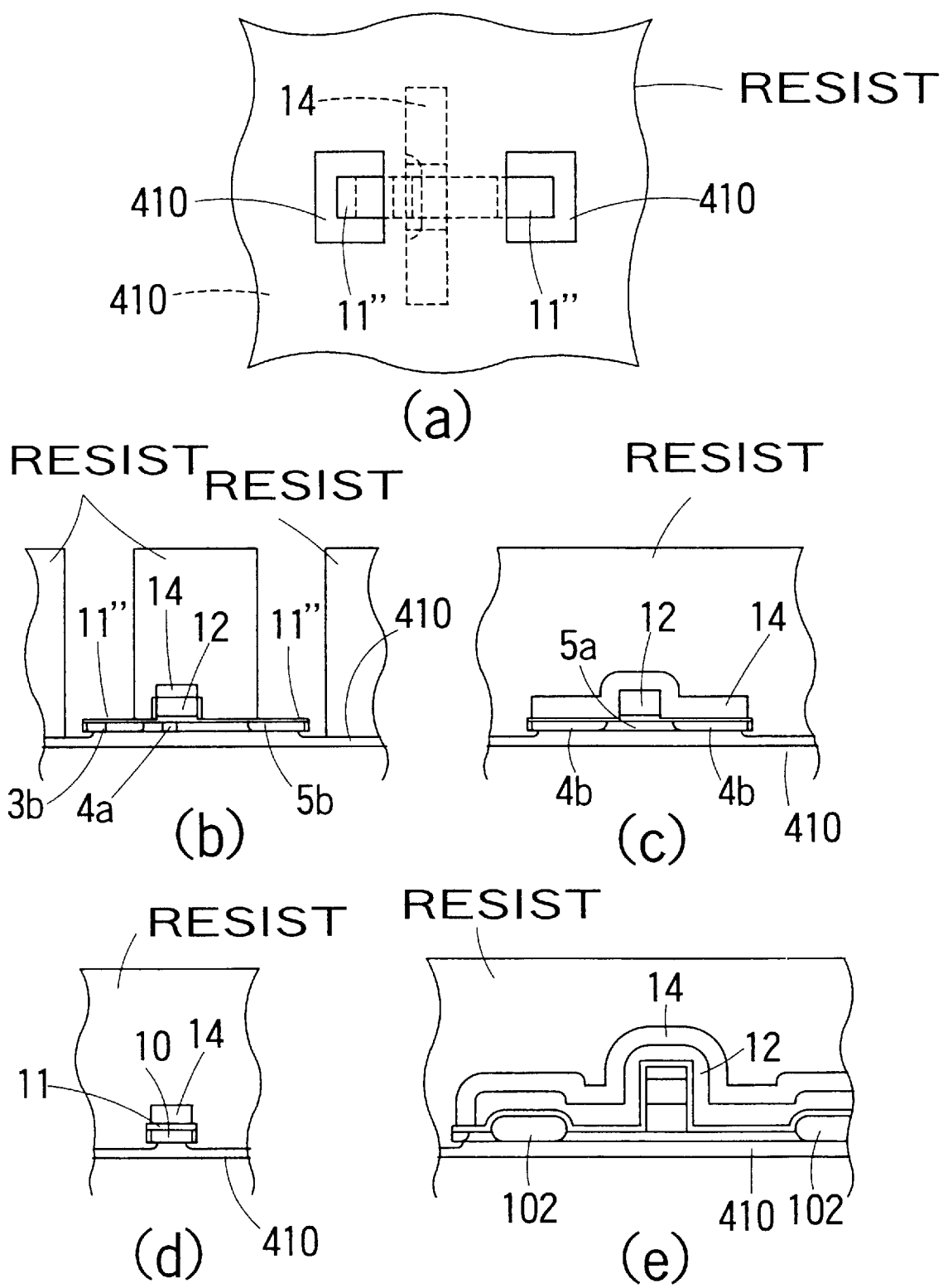

Next as shown in FIG. 11, the external emitter region and the external collector region are made. More specifically, using the second mask 14 and a resist as a mask, an n-type impurity such as phosphorus (P) or arsenic (As) are doped by ion implantation to form the n$^+$-type external emitter region 3b and the n$^+$-type external collector region 5b, if necessary, through annealing. In this case, it is sufficient only that the low-resistance diffusion layer can be made. Therefore, ions may be injected near the surface layer of the semiconductor thin film 10, and the problem of change to a polycrystalline phase does not occur. Additionally, combination and sequence of ion implantation of the n$^+$-type emitter region 3a, n$^+$-type external emitter region 3b and n$^+$-type external collector region 5b can be changed.

At this stage, the basic portion of the bipolar semiconductor device is basically completed, and the first and second masks 12, 14 in the MOS transistor portion are removed. If the source and the drain are not made yet, they are made here by any appropriate process, and an inter-layer insulating film is stacked to proceed to the next wiring step.

As shown in FIG. 12, the first mask and the second mask are removed. Since the embodiment shown here progresses the process by using a polycrystalline silicon film as the first mask 12, it is preferably removed together with the second mask 14 to avoid a structure having a non-insulating film adjacent to the surface of the transistor as explained with reference to FIG. 6. Although a nitride film is used here as the second mask 14, both the nitride film and the polycrystalline silicon film can be removed with a selectivity as large as decades with respect to an oxide film by using isotropic dry etching. Therefore, using the oxide film as the protective film 15 and the oxide film as the stopper film 11 or 11" as a stopper, the first mask 12 and the second mask 14 can be removed entirely.

In the removal step, even if the protective film 15 remains in form of a fence as shown in FIG. 12, it can be readily removed by using NH$_4$F liquid, for example. Also as to the stopper film 11 or 11" still remaining heretofore, any oxide film can be removed by using can be also removed by using NH$_4$,F liquid, and a nitride film can be removed by using heated phosphoric acid, for example.

After the semiconductor thin film 10 is shaped into a flat planar sheet having no steps and having an approximately crossing pattern is made through these steps, the step of making a desired inter-layer insulating film or wiring (not shown) is conducted to complete the bipolar type transistor.

According to the manufacturing method explained above, by maintaining the first-made stopper film 11 at least on the upper surface of the semiconductor thin film 10 up to the final one of the steps for making the central part, the semiconductor thin film with no step on its upper surface can be made without damages by treatments other than ion implantation. Therefore, a high-performance transistor can be realized with no deterioration in carrier mobility along the surface.

In the embodiment explained above, the length of the n$^-$-type collector region 5a is determined by how the n$^+$-type external collector region 5b is made. Therefore, any misalignment in the photo lithography process conducted here invites fluctuation of approximately hundreds of nm, and characteristics are liable to vary accordingly. Particularly, the emitter-to-collector breakdown voltage and current gain are liable to vary.

Figure 14:
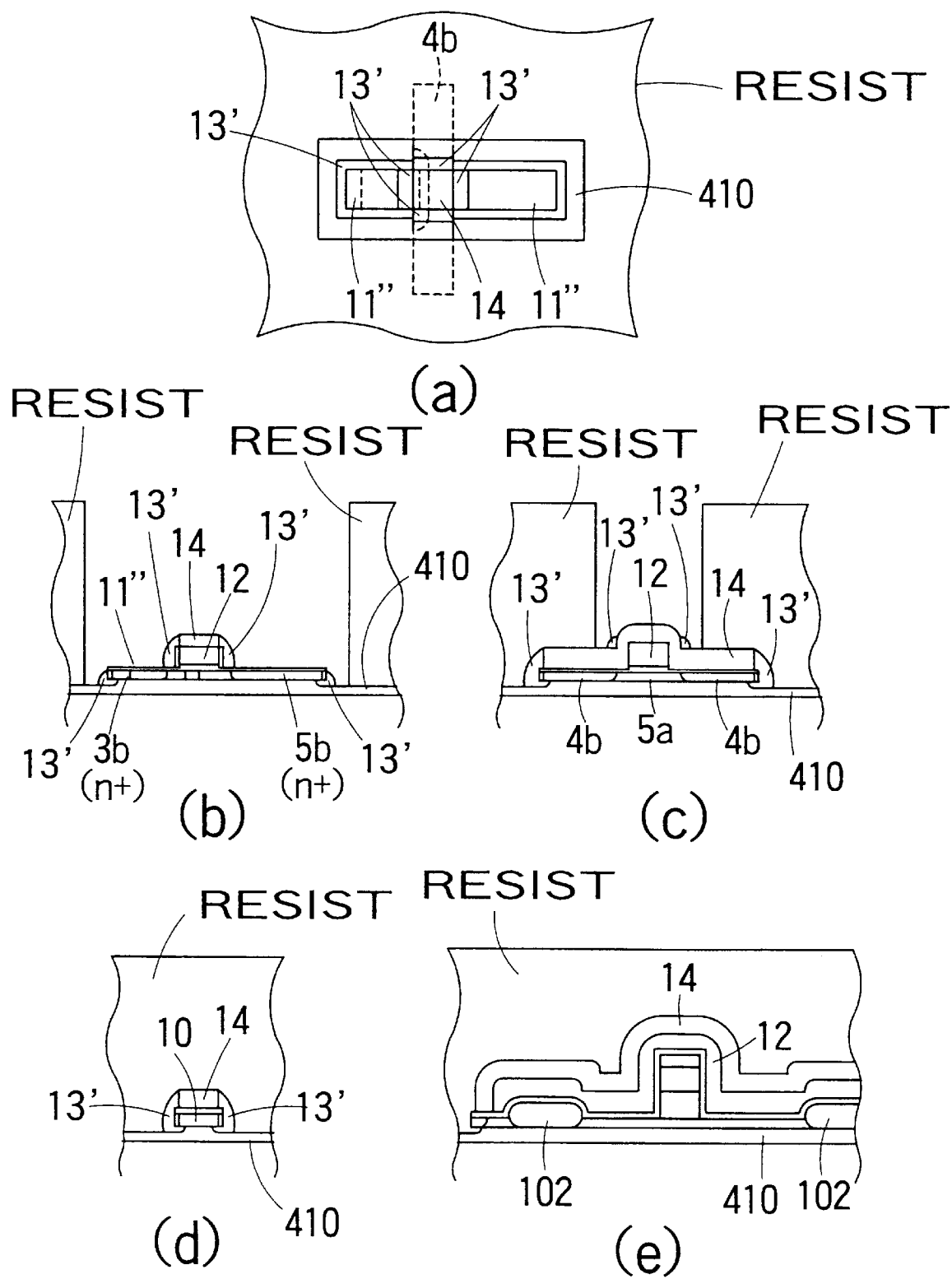
FIG. 14 is a diagram schematically illustrating an alternative step in the manufacturing method shown in FIGS. 4 through 12.

FIG. 14 is diagrams illustrating a step of a manufacturing method overcoming the above-mentioned issue. The process shown here corresponds to the process shown in FIG. 11. That is, after the type base region 4a and the n$^+$-type emitter region 3a are made as shown in FIG. 10, a side wall film 13' in form of a polycrystalline silicon film, oxide film or nitride film, for example, is made, and an n-type impurity such as arsenic (As) or phosphorus (P) is ion-implanted via a resist mask exposing the laterally elongated rectangular portion. In this case, the n$^+$-type external collector region 5b is made simultaneously with the n+-type external emitter region, Actually, the lithography step is not always necessary.

As a result, the length of the n−-type collector region 5a can be determined by the width of the longitudinally elongated rectangle and the thickness of the side wall film 13', and reproducible characteristics can be realized. Also when polycrystalline silicon is used as the side wall film, it can be removed simultaneously in the separation step shown in FIG. 12.

In the method shown in FIG. 14, if the side wall film 13' is an oxide film or a nitride film, then a low-resistance silicide film can be made selectively by a self-aligned silicide process on the n+-type diffusion layer on the emitter side and the collector side exposed by formation of the side wall film 13'. As a result, the emitter and collector resistances can be reduced significantly, and the high-frequency characteristics are improved.

In the above-explained manufacturing method, it is difficult to control the process when the external base regions is electrically connected to the internal base region relying on the impurity laterally diffused from the external base regions. Moreover, as referred to above, if the external base regions are brought excessively close to the internal base region, there occur the problems: an increase of the collector resistance and deterioration of the current gain ($h_{FE}$), cut-off frequency ($f_T$), and emitter-to-base breakdown voltage ($BV_{CEO}$) due to of a high-concentrated pstep-shaped p–n junction between the emitter and the base.

As a method for removing these problems, already explained is the method which separates the p+-type region and the internal base region from each other by increasing the thickness of the side wall film 13 upon ion implantation into the external base regions, and additionally makes the link region between the p+-type region and the internal base region. This method, however, additionally needs the lithography step and the ion implantation step, and hence increases the manufacturing cost.

Taking it into account, next explained is a manufacturing method for simultaneously making the internal base region and the link region. This method overcomes the problems, concentration of the current in the collector and deterioration of the resistance to voltage at the emitter-base junction by using a process which is easily controlled and needs no additional steps.

FIGS. 15 through 24 are cross-sectional views illustrating different steps in the manufacturing method according to the second embodiment. First referring to FIG. 15, the process starts with making a gate electrode of a MOS transistor and an external base of a bipolar transistor. More specifically, LOCOS is conducted for separation of MOS transistor elements. After that, an n-type impurity of a concentration of $10^{16}$ to $10^{17}$ cm$^{-3}$ for making an n−-type collector of the bipolar transistor. Then, a gate oxide film 550 and gate electrodes are made, and the gate electrodes are patterned. In the bipolar transistor region, the gate electrode is removed by etching.

Figure 15:
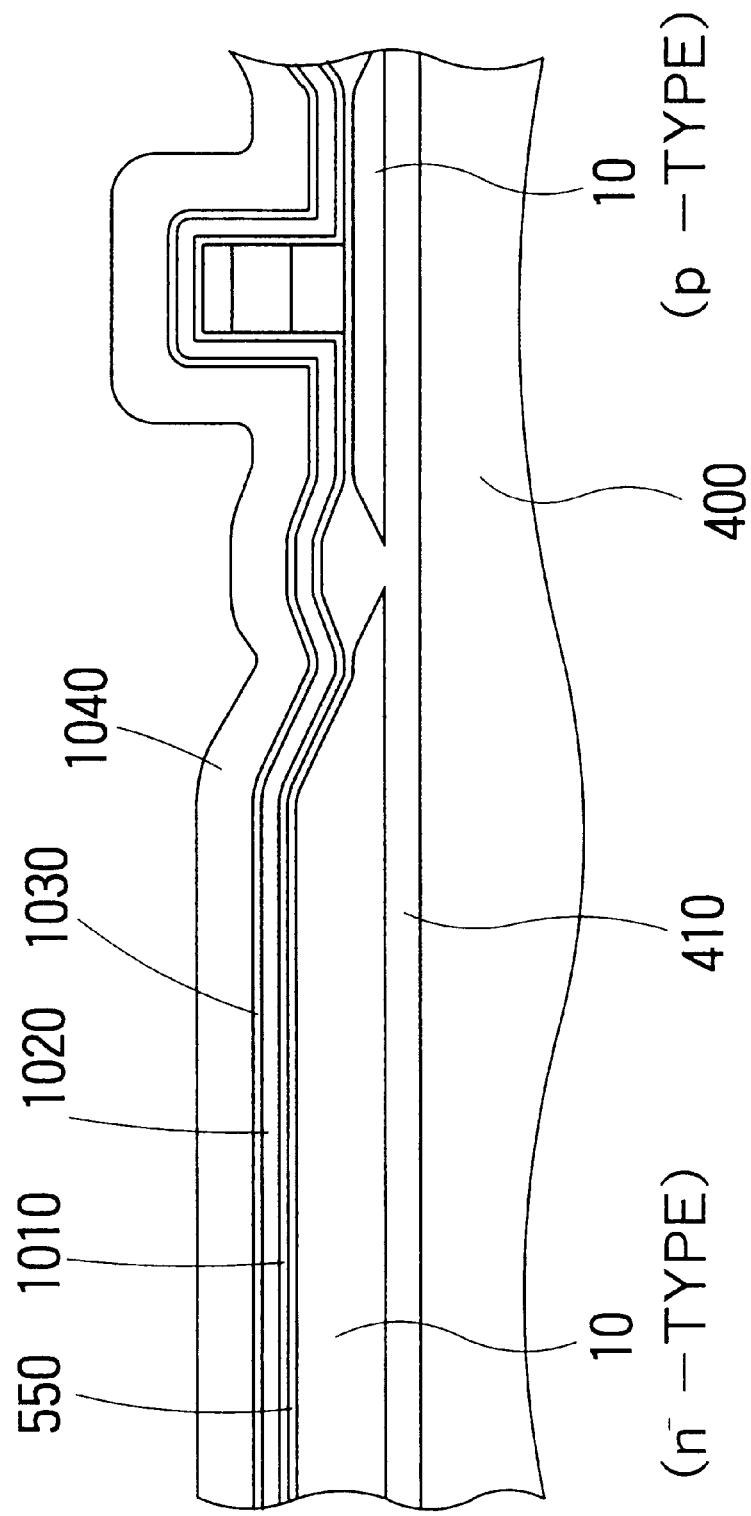
FIGS. 15 through 24 are cross-sectional views illustrating different steps in a manufacturing method according to the second embodiment of the invention.

Still referring to FIG. 15, next stacked on the entire substrate surface are, in sequence, a 200 Å thick oxide film 1010, 500 Å thick nitride film 1020, 200 Å thick oxide film 1030 and 2750 Å thick polysilicon 1040.

The process next enters into the step for defining the device structure of the bipolar transistor.

Figure 16:
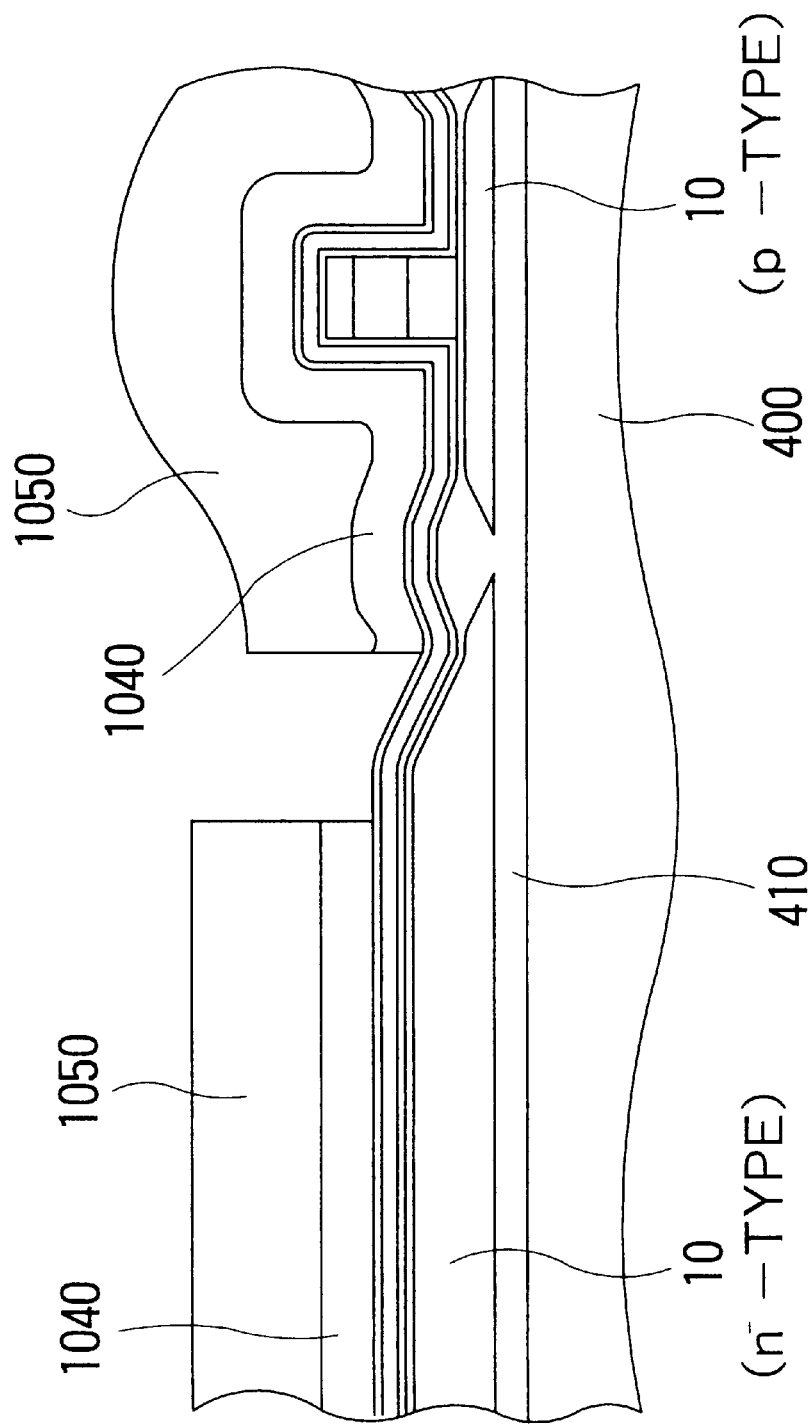

First referring to FIG. 16, a resist pattern 1050 configured as the "second pattern" shown in FIG. 2 is made in a location for the bipolar transistor, and the polysilicon 1040 is partly removed by anisotropic etching. In this status, the MOS transistor region is masked by a resist 1050.

Figure 17:
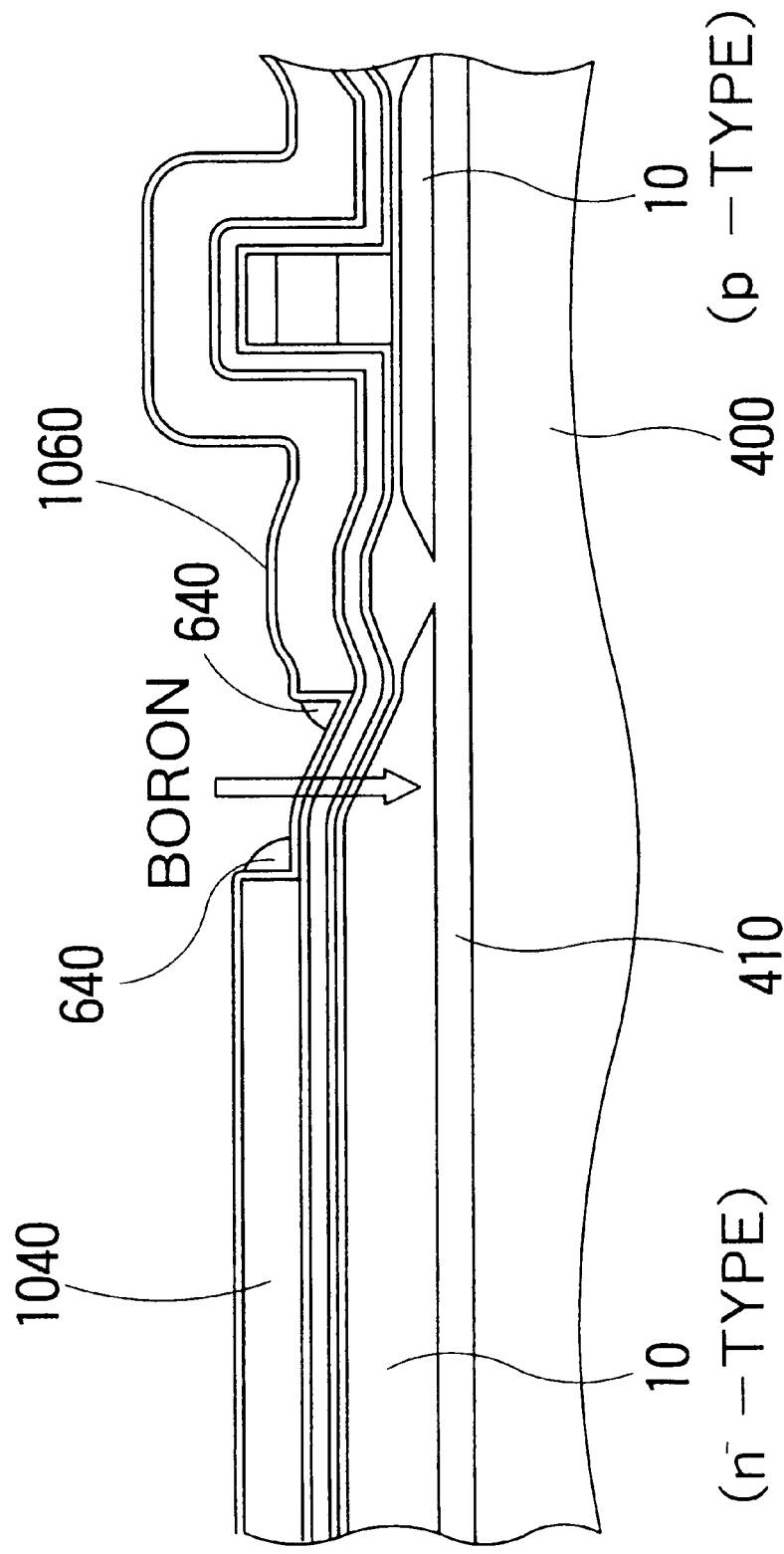

Next as shown in FIG. 17, a 200 Å thick oxide film 1060 and a 200 Å thick polysilicon layer are stacked sequentially, and the polysilicon layer is etched back by anisotropic etching to form a polysilicon spacer 640 on side walls.

Figure 18:
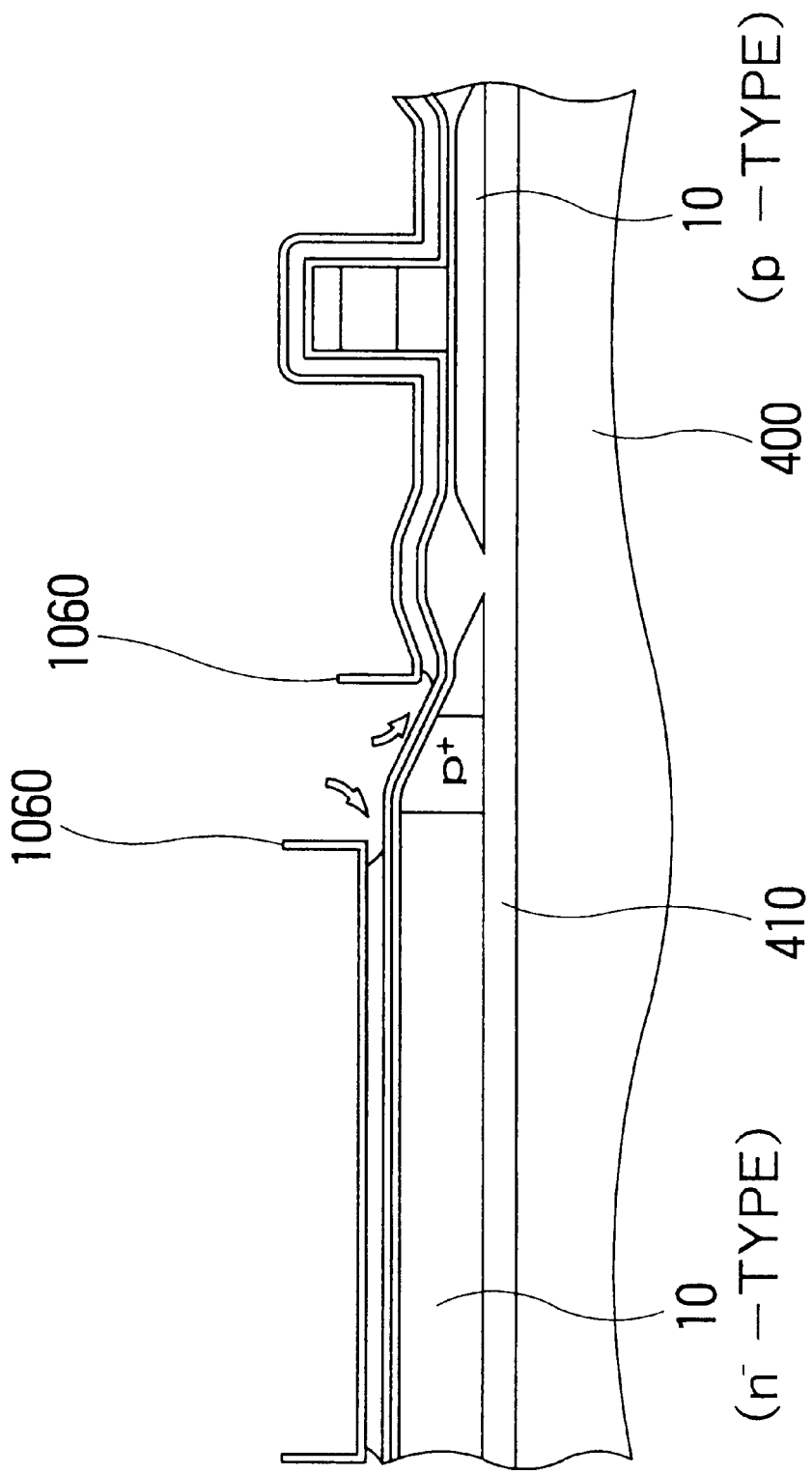

After that, boron (B) ions are implanted into the external base region under an acceleration energy as large as 50 keV, approximately, by a dose amount as large as $10^{15}$ cm$^{-2}$. The parasitic base resistance can be reduced remarkably by setting the boron concentration of the external base region higher than that of the base region. Here is made a diffusion layer with a concentration of $10^{20}$ cm$^{-3}$ or more. Boron is ion-implanted into a part of the semiconductor layer not covered by polysilicon mask 1040, and is laterally diffused to the other part of the semiconductor layer under the mask by later annealing. To prevent the above-mentioned problems, it is preferable to select thickness of polysilicon spacer 640, annealing conditions, and ion implanatation conditions which promise that a concentration is decreased to become equal to that of the internal region at a position distant from the boundary D of FIG. 3A Next as shown in FIG. 18, the polysilicon spacer 640 is selectively removed by CDE (Chemical Dry Etching Then, the oxide films 1030 and 1060 are selectively removed by anisotropic etching by using the nitride film 1020 and the polysilicon 1040 as an etching stopper. Additionally, the nitride film 1020 and the polysilicon 1040 are removed simultaneously by CDE, and the "second pattern" in FIG. 2 is copied onto the nitride film 1020. Thereafter, the fence-shaped oxide film 1060 shown in FIG. 18 is removed by wet etching using dilute ammonium fluoride (NH$_4$F).

Figure 19:
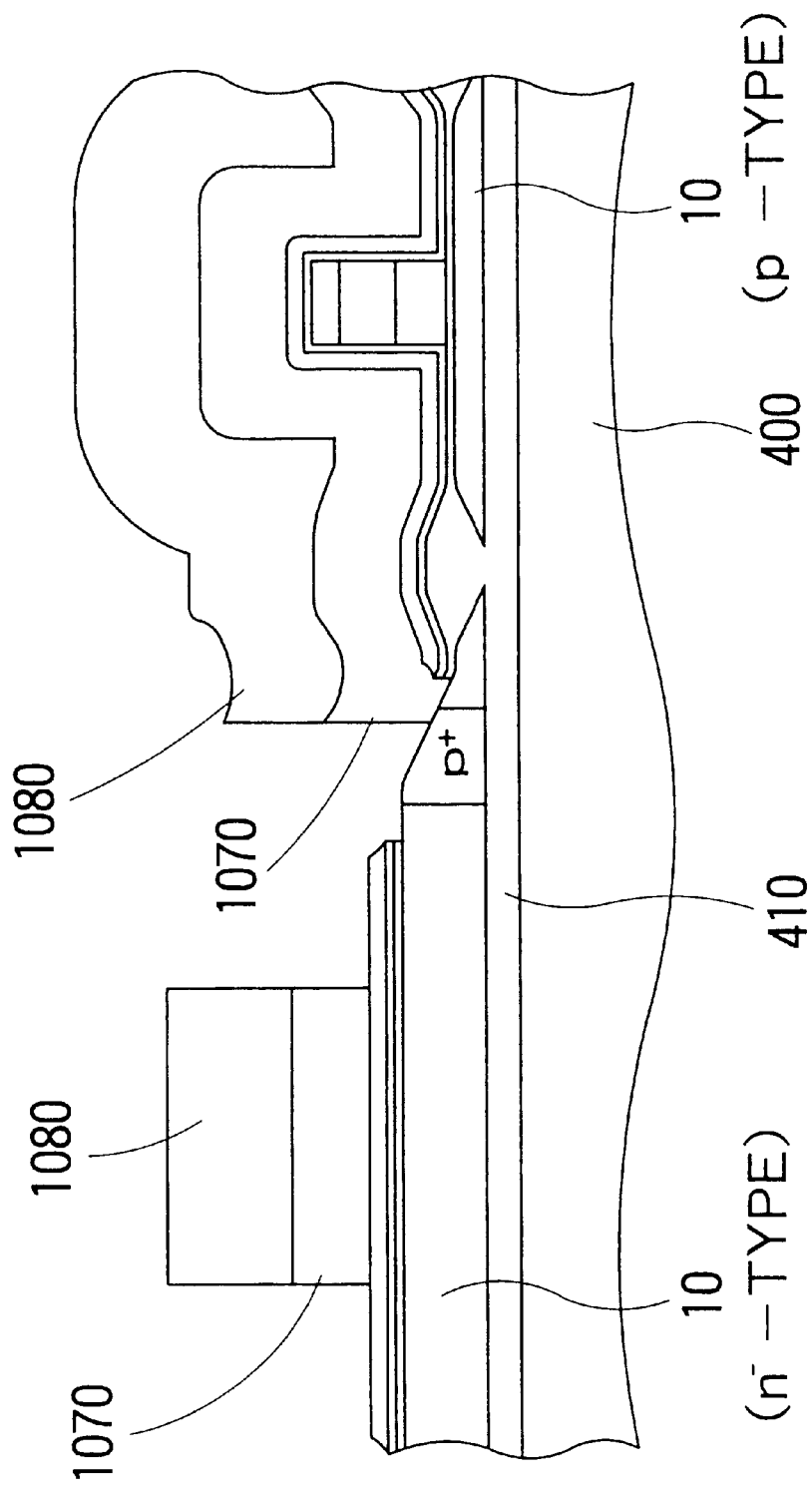

Next as shown in FIG. 19, a 3000 Å thick oxide film 1070 is next stacked on the entire substrate surface to make a resist pattern 1080 corresponding to the "first pattern" in FIG. 2, and the oxide film 1070 is partly removed by anisotropic etching using the nitride film 1020 as an etching stopper. Here again, the MOS transistor region is masked.

Figure 20:
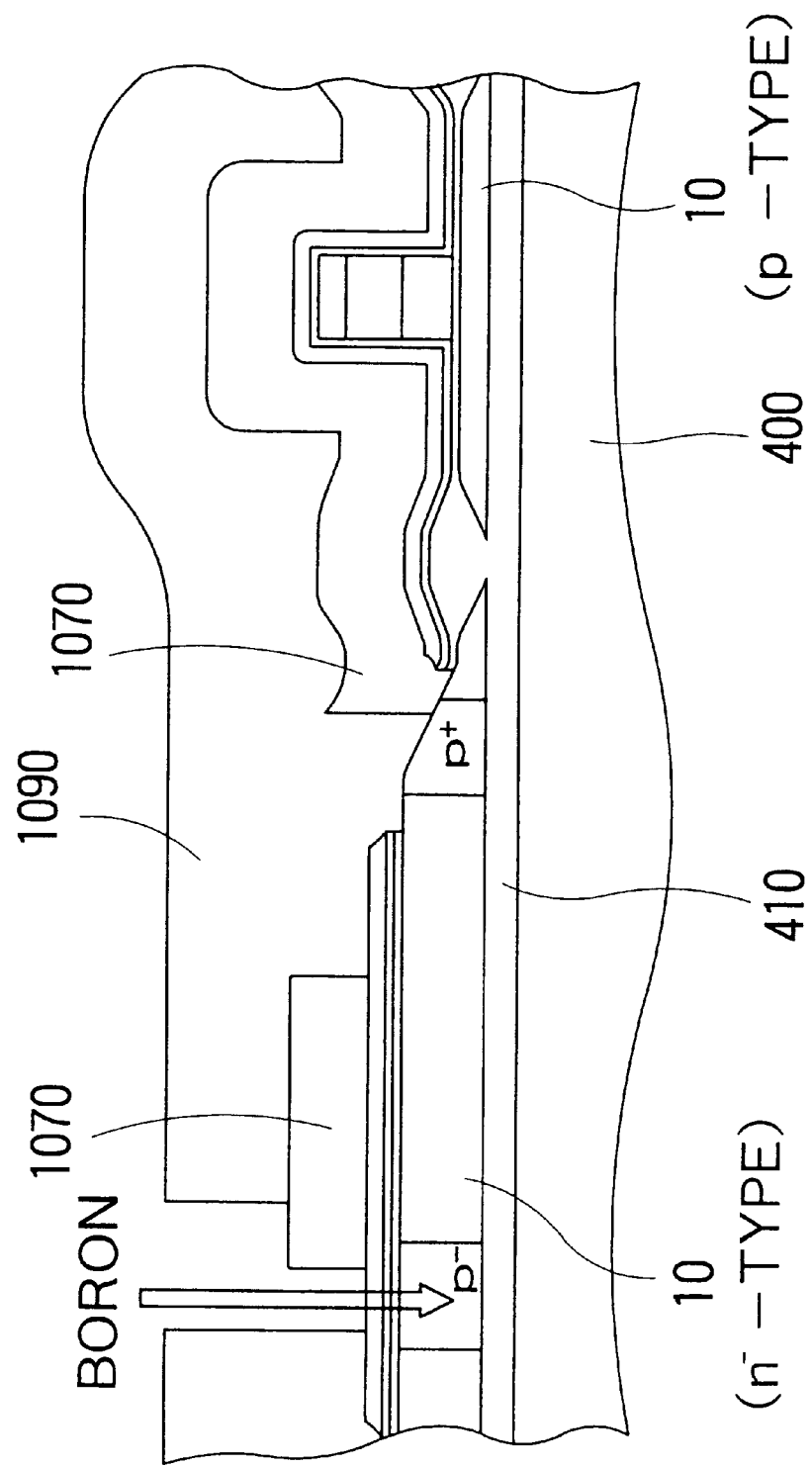

Next as shown in FIG. 20, the resist 1080 is removed, a resist pattern 1090 having an opening in the location of the internal base and the link base is made, and boron (B) ions are implanted under an acceleration energy around 25 keV by a dose amount around $10^{14}$ cm$^{-2}$ to form the internal base region and the link base region. The resist 1090 is removed thereafter.

After that, boron is diffused under the oxide film mask 1070 by annealing to form the internal base region and the link base region. The annealing preferably precedes the anisotropic etching of the semiconductor layer because, if it is after anisotropic etching of the semiconductor layer, concentration of boron to be diffused into the link base region will decrease, and the base resistance will increase.

In this step, since boron is drawn out into the oxide film 410 along the boundary between the semiconductor layer 10 and the oxide film 410, the boron concentration of the semiconductor layer 10 tends to decrease, and it invites the punch-through problem of the bipolar transistor along the boundary. To prevent it, ion implantation is preferably conducted previously to make a higher boron concentration near the boundary. More specifically, boron ions are implanted under a relatively low acceleration energy around 20 keV to make a peak concentration near the surface of the semiconductor layer 10, and boron is ion-implanted under a relatively high acceleration energy around 45 keV to make a peak concentration near the bottom surface of the semiconductor layer 10. After that, the internal base region and the link base region are made by annealing.

Figure 21:
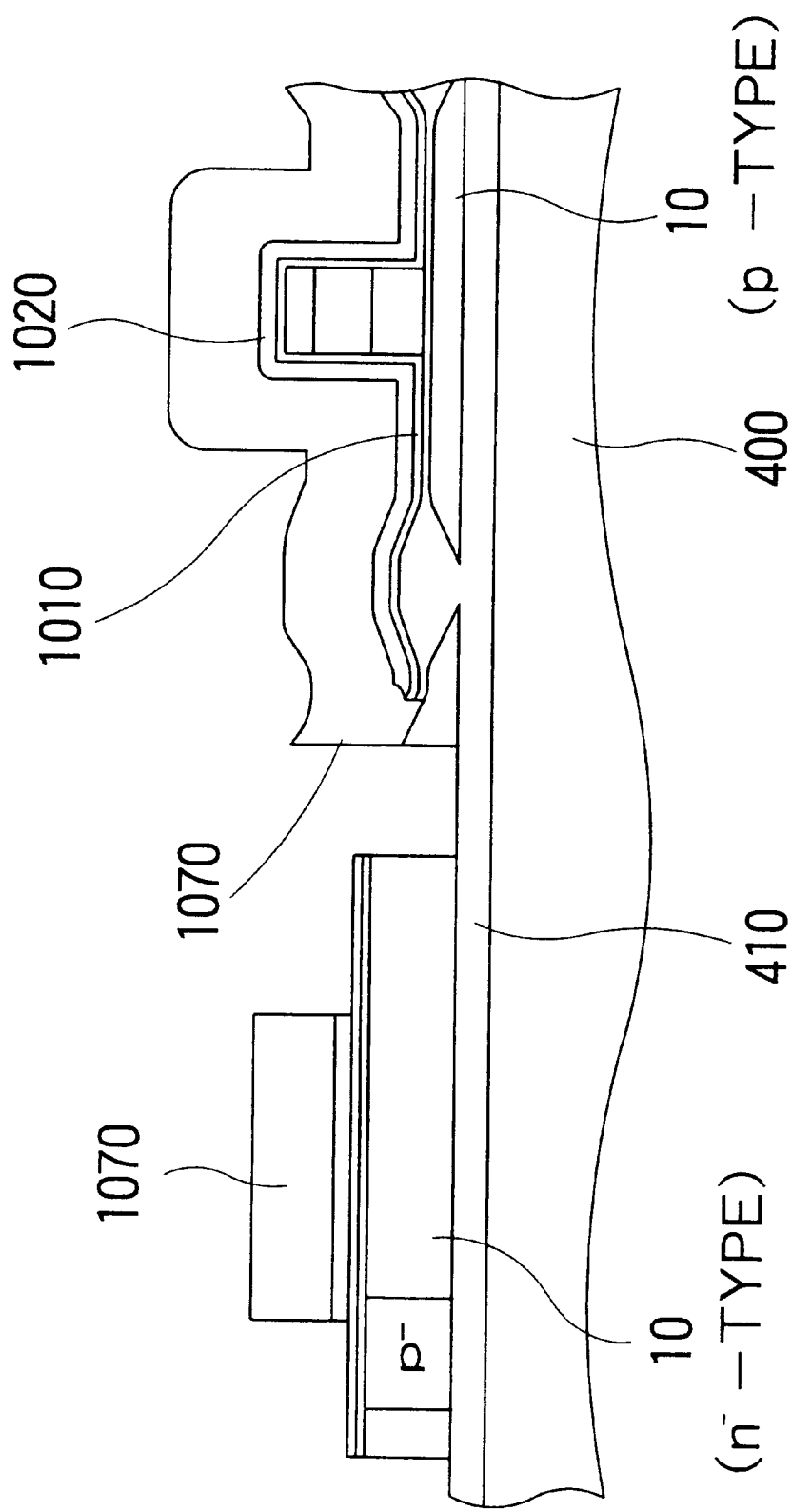

Next as shown in FIG. 21, anisotropic etching is conducted to silicon to isolate a part of the semiconductor layer.

In this case, part of the nitride film 1020 heretofore overlying the external emitter region is also removed, and the etching stops at the oxide film 1010. The external base regions are masked from the etching by the oxide film 1070. To recover damages on side walls of the semiconductor layer 10, a thickness around 100 Å of the side walls of the silicon layer 10 is removed by CDE, the side walls are oxidized by 100 Å approximately.

Figure 22:
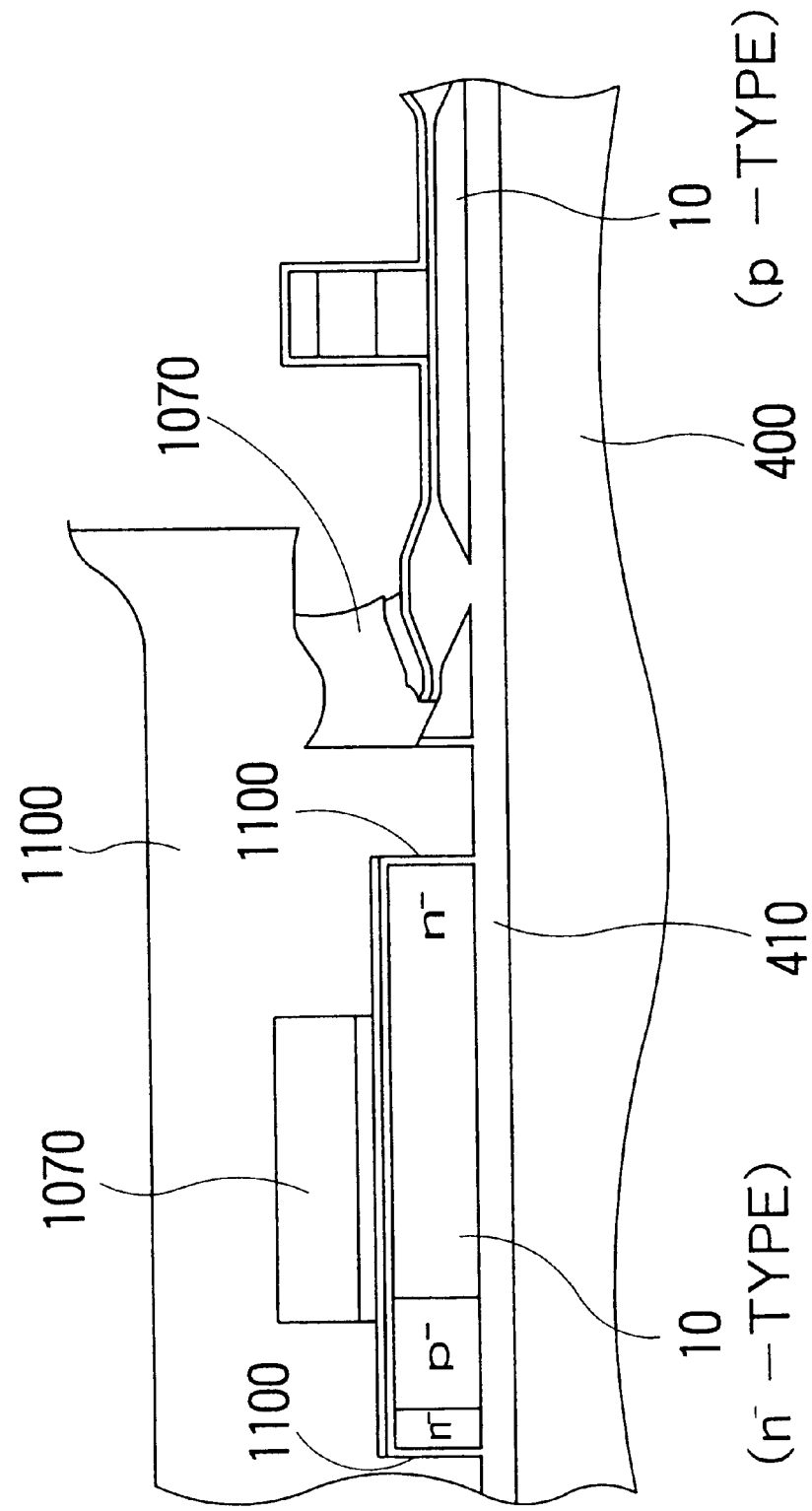

Next as shown in FIG. 22, after the bipolar transistor region is masked by a resist mask 1110, the oxide film 1070 in the MOS transistor region is removed by wet etching, using the nitride film 1020 as an etching stopper, and the nitride film 1020 is next removed using the oxide film 1010 as an etching stopper.

Then, the process enters into the next step for making the source and the drain, external emitter region and external collector region of the MOS transistor region. First stacked on the entire substrate surface are a 200 Å thick oxide film 1120 and 1000 Å thick polysilicon, and anisotropic etching is conducted to make a polysilicon spacer 1130 on side walls of the gate electrode and side walls of the mask material 1070 of the first pattern The source and the drain of the MOS transistorare preferably configured to have a low-concentrated region with a shallow junction depth (so-called LDD structure). Further, it is preferably configured to include a high-concentrated diffusion layer with a low resistance outside the LDD. Therefore, also for preventing an increase of the sheet resistance of the high-concentrated diffusion layer due to change into an amorphous phase explained above, it is preferably designed so that concentration reaches a peak near the sur face.

Figure 23:
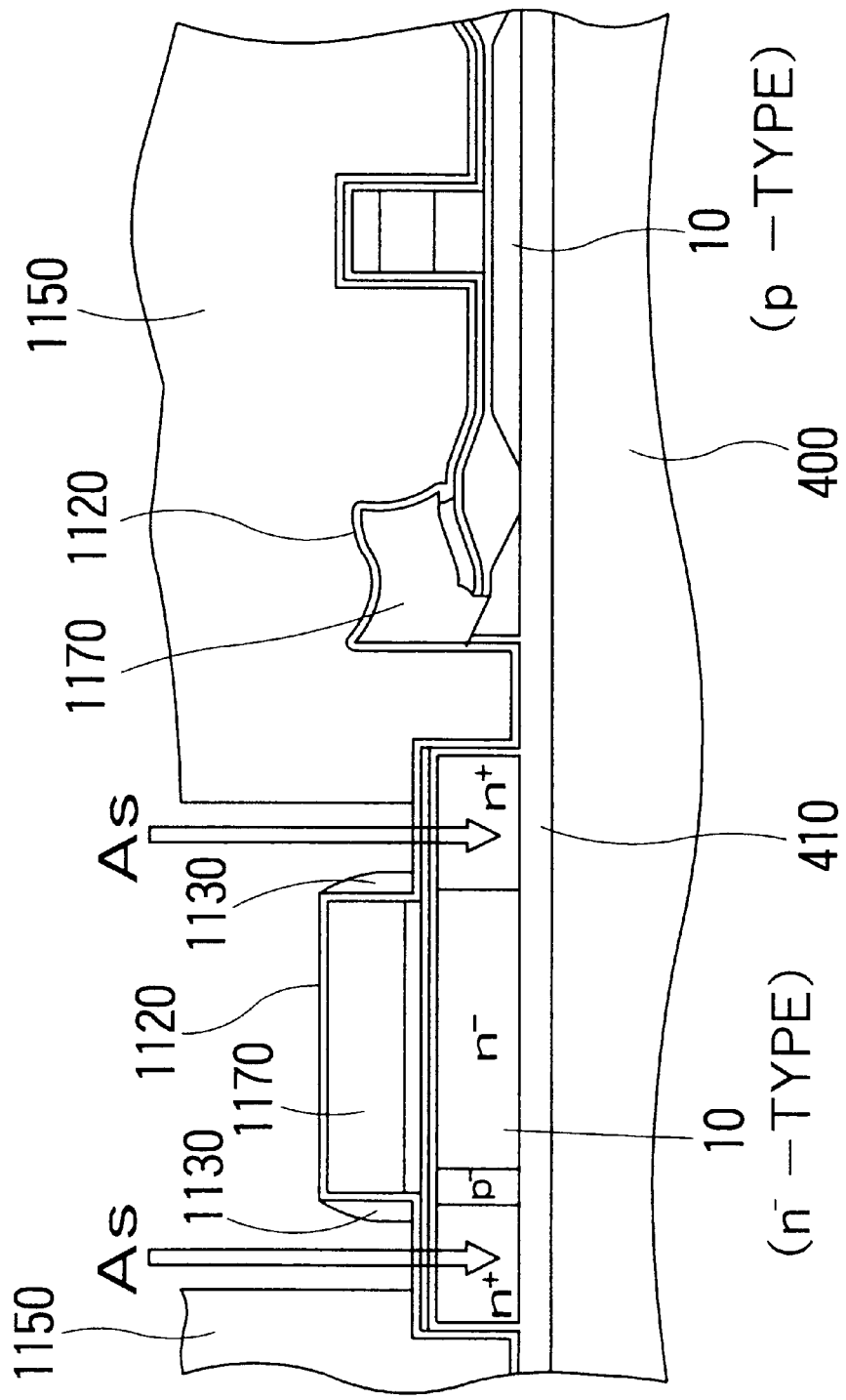

Next as shown in FIG. 23, formed is a resist pattern 1150 which is open only on the bipolar. Then, arsenic is implanted with a dosage of $10^{16}$ cm$^{-2}$ to make the emitter region whose impurity content ration is about $10^{21}$ cm$^{-3}$. The injection energy of arsenic is made somewhat high to cancel the p-type base region at the bottom of the silicon layer 10 and change to an n-type at the final stage after annealing so that no parasitic emitter-base junction be made. After that, the polysilicon spacer 1130 is removed by CDE, and the resist pattern 1150 is removed thereafter.

Next conducted is annealing for recrystallizing the semiconductor layer which was changed to an amorphous phase during ion implantation. Annealing is preferably done by RTA (rapid thermal annealing) at a temperature around 900 through 1100 degrees in centigrade for about 20 to 30 seconds and by furnace annealing at a temperature around 800 degrees in centigrade or higher for one hour approximately. RTA is conducted for the purpose of activating the emitter impurity, and high-temperature RTA is effective to increase the rate of activation especially when high-concentrated arsenic is used. It is very important to increase the carrier concentration of the emitter for the benefit of current gain and $f_T$ of the bipolar transistor and a decrease of the emitter resistance. Subsequent furnace annealing is conducted for the purpose of diffusing the n-type impurity deep to the bottom surface of the SOI layer. Especially when arsenic is used, there is the possibility that a neutral p-type region remains at the bottom of the SOI layer under an acceleration energy of arsenic determined to prevent the entire SOI layer from changing to an amorphous phase. To prevent it, furnace annealing is executed to diffuse the n-type impurity also to the bottom of the SOI layer.

Figure 24:
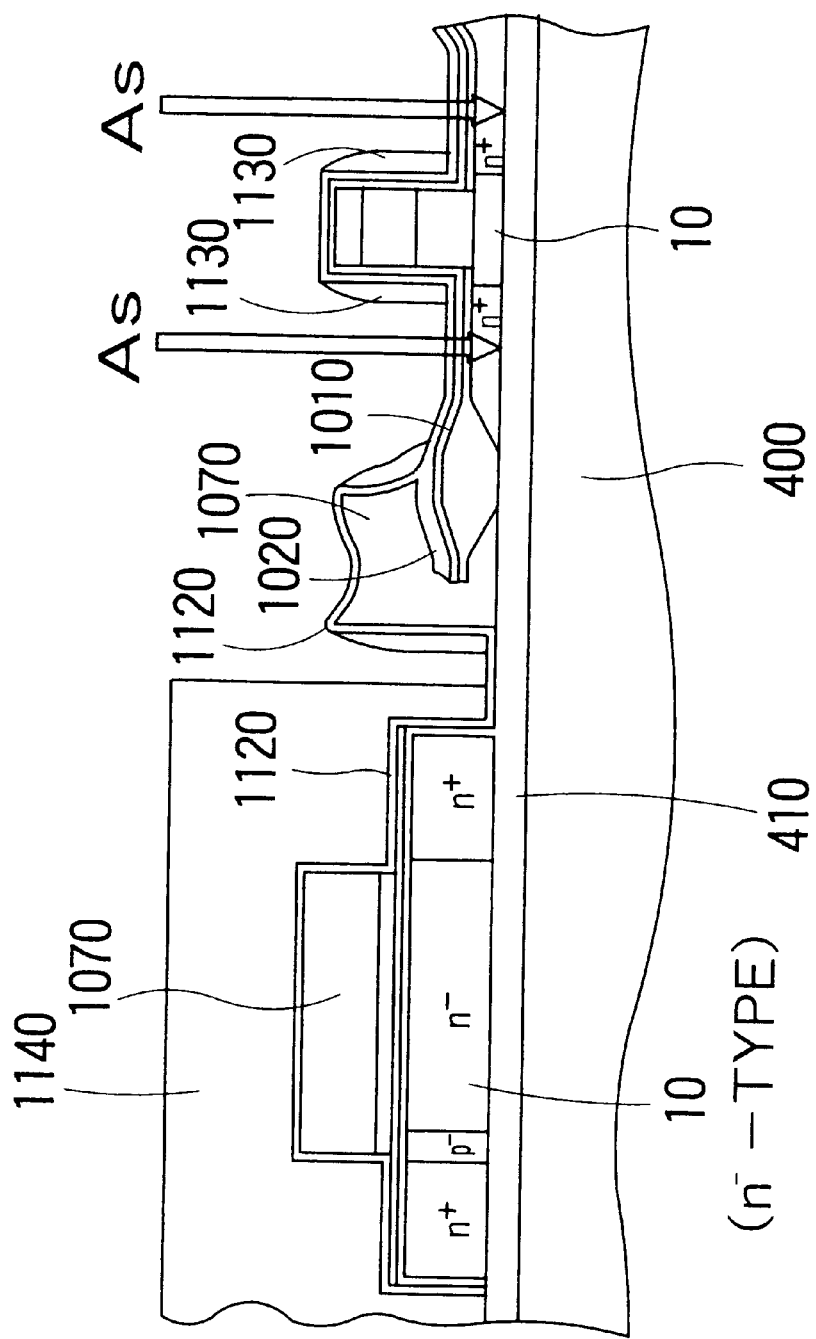

Next as shown in FIG. 24, formed is a resist pattern 1140 which is open on the n-channel type MOS transistor region.

Then, an n-type impurity is implanted to make a high-concentrated n-type diffusion layer. Arsenic (As) is preferably used as the n-type impurity. In this case, arsenic is ion-implanted to make a peak concentration near the surface of the silicon layer 10 so as to maintain a single crystal layer near the bottom of the silicon layer 10. After that, the polysilicon spacer is removed by CDE, and an n-type impurity is next implanted to make a low -oncentrated n-type diffusion layer. Here again, arsenic is implanted to make a peak concentration near the surface of the silicon layer to make the junction depth shallower. Then, the resist is removed. The similar steps are taken also for the p-type MOS transistor region.

After that, for recovery of the crystallographic property, RTA is conducted at 900° C. for 30 seconds. By executing LDD ion implantation and annealing after high-temperature RTA and furnace annealing for making the emitter, diffusion of the impurity in the LDD region can be minimized. Further, unlike arsenic for the emitter, a peak of concentration can be set near the surface. As a result, short channel effect of the MOS transistor can be prevented effectively, and the resistance of the diffusion layer can be decreased.

For subsequent steps for making an inter-layer film and a contact, a typically used process may be used.

The first and second embodiments involve the problem that the manufacturing cost increases because of the need for a number of steps of stacking and removing mask materials for masking two patterns. Next explained is a manufacturing method which decreases and simplifies steps and therefore decreases the manufacturing cost.

Figure 25:
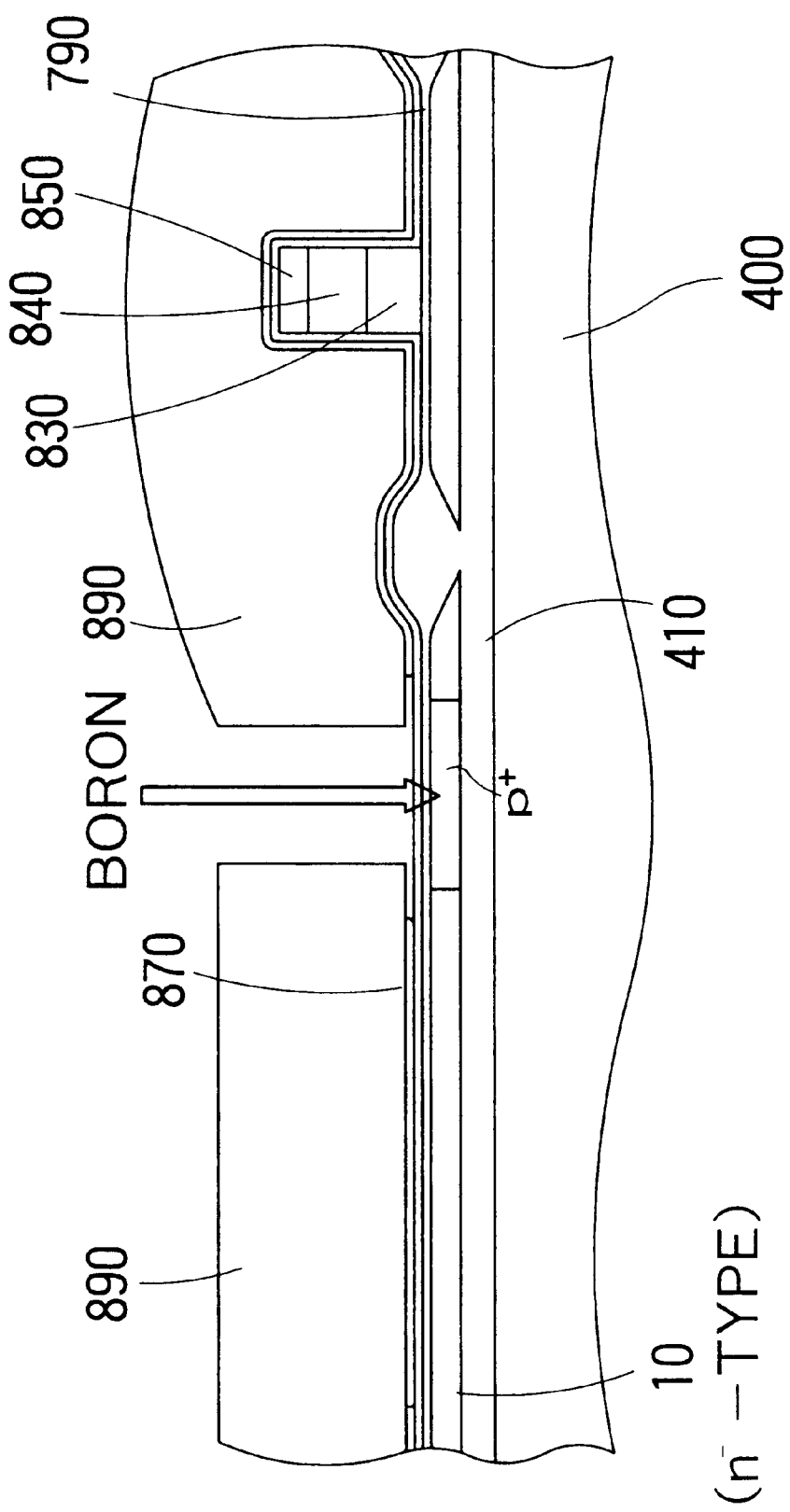
FIG. 25 is a cross-sectional view illustrating different steps in a manufacturing method according to the third embodiment of the invention.

FIG. 25 is a cross-sectional view illustrating different steps in the manufacturing method according to the third embodiment. First conducted is similar process explained in FIG. 15 to form MOS transistors.

Next stacked on the entire substrate surface are, in sequence, an oxide film 860 as thick as 200 Å approximately and a nitride film 870 as thick as 500 Å approximately. Then, a resist mask 890 larger than the second pattern of FIG. 2 by 2000 Å is made, and isotropic etching is conducted to make the nitride film 870 retract by 2000 Å. During this process, the MOS region is masked by the resist mask 890.

After that, a p-type impurity such as boron is implanted into the external base region.

Another method for patterning the nitride film 870 is explained below. First made is a resist mask 890 larger than the second pattern by 2000 Å. Then, a p-type impurity such as boron is ion-implanted into the external base region. After that, resist ashing is conducted to make the resist retract laterally by 2000 Å. The, the nitride film is selectively removed by anisotropic etching. This method is very simple as well, and does not increase the manufacturing cost.

Subsequently there follow the same steps as those as from FIG. 19 of the second embodiment.

The bipolar transistor explained heretofore features less variance in characteristics. This is because the overlapping portion of two patterns is rectangular as shown in FIG. 3A, and alignment is done not to change the size of the rectangle even upon any misalignment between two patterns, to use the rectangular region as the n⁻-type collector region and form the external base regions, external collector region and emitter-base junction in alignment with individual sides of the rectangle. However, there are some problems accompanying the structure of the bipolar transistor explained above. One of them is that the path for electron current flowing from the emitter toward the collector is narrower than the conventional structure because the n-type collector region is interposed by a pair of p+-type external base regions, that is, the external base-collector junction extends normally to the emitter-base junction.

This phenomenon is explained for respective regions. In the collector, the depletion layer of the external base-collector junction extends toward the collector with a low impurity concentration, and makes the width of neutral region of the collector (Wc) narrower. As a result, electrons flowing through the collector are crowded concentrate to a central portion, and the current density increases in the collector central portion. This invites an increase of the collector resistance, and results in deteriorating high-frequency characteristics such as cutoff frequency $f_T$ and maximum oscillation frequency $f_{max}$, for example.

Also inside the base region and near the base end of the base-collector depletion layer, the conventional structure permits electrons to spread outwardly. Therefore, the electron density rapidly decreased from the emitter end of the base region toward the collector end. In the above-explained structure, however, electrons cannot spread outwardly, and the electron density gradient becomes lower than the conventional structure i.e. (the effective base width becomes larger). Since the collector current is proportional to the electron density gradient, the structure according to the invention decreases the collector current (electron current) and hence decreases the current gain $h_{FE}$. Additionally, because the base transit time $\tau_B$ can be expressed as, $$\tau_B = \frac{q \int_0^{WB} n\, dx}{Jn}$$

where n is the electron density, $J_n$ is the electron current density, the base transit time increases with a decrease of the electron current, and high-frequency characteristics such as $f_T$ and $f_{max}$ degrade.

In order to overcome the problem, it is effective to a certain extend to increase the width $W_C$ of the collector neutral region by increasing the thickness of the side wall film 13 as explained in the manufacturing method taken as the second embodiment, or by increasing the dimensional difference between the nitride film mask 870 and the resist mask 890 as explained in the manufacturing method taken as the third embodiment. In such structure, however, the link base region shown at c in FIG. 3A is elongated, and the parasitic base resistance increases. An increase of the parasitic base resistance leads to deterioration of high-frequency characteristics such as $f_{max}$.

The second problem lies in a lowbase-to-collector (junction breakdown voltage) because of the closely adjacent junction between the p+-type external base region and the n+-type external collector region. In general, the shorter the n−-type collector region between the internal base and the external collector, the lower the collector resistance, and high-frequency characteristics are improved, though base-to-collector breakdown voltage is deteriorated. Since the p+-type external base and the p-type internal base are in parallel alignment with the n+-type external collector in conventional longitudinal type bipolar devices and the bipolar device shown in FIG. 36, the length of the n−-type collector sandwiched between the internal base and the external collector is equivalent to the length of the n−-type collector sandwiched between the external base and the external collector, and the length of the latter never limits the breakdown voltage. However, in the embodiment of the invention explained above, breakdown voltage is limited by the distance between of the external base and the external collector, and the bipolar transistor does not perform its true high-frequency characteristics.

Next shown is an embodiment of the invention taking account of the above-mentioned problems. That is, it is directed to realizing a bipolar transistor remarkably improved in high-frequency characteristics by simultaneously overcoming the issues: a decrease of the parasitic emitter-base junction, a decrease of the parasitic base resistance, and concentration of the electron current.

It is also directed to realizing a bipolar transistor improved in high-frequency characteristics by simultaneously overcoming the issues: a decrease of the parasitic emitter-base junction, a decrease of the parasitic base resistance, and improvement of the breakdown voltage at the base-collector junction.

Figure 26:
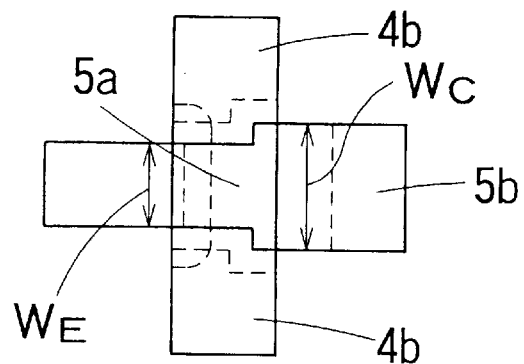
FIGS. 26 through 28 are plan views schematically showing bipolar transistors modified toward specific purposes according to the invention.

FIG. 26 shows a bipolar transistor overcoming the above-mentioned first problem. The transistor does not employ a rectangle as the shape of the "first region", i.e. the n−-type collector region where the first pattern and the second pattern overlap, but makes the collector width Wc of the external collector longer than the emitter width $W_E$. In this manner, concentration of the electron current near the external collector can be prevented. Additionally, the parasitic emitter-base junction is reduced than the conventional transistor, and resistance of the link base region is also reduced than that of the conventional transistor. As a result, high-frequency characteristics can be improved as compared with the conventional technique.

Figure 27:
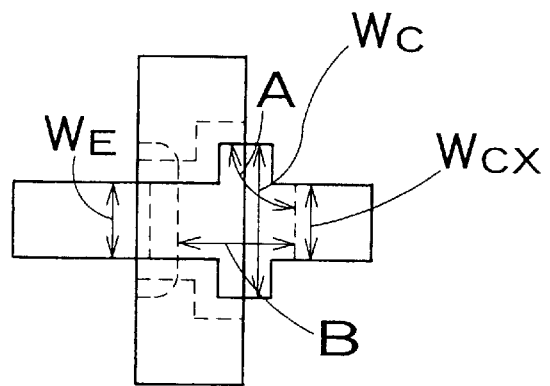

FIG. 27 illustrates a bipolar transistor simultaneously overcoming both the first problem and the second problem. The transistor shown here does not employ a rectangular shape for the "first region", namely, the n−-type collector region, where the first pattern and the second pattern overlap, but makes the collector width Wc of the external collector longer than the emitter width $W_E$. At the same time, the width Wcx of the n+-type external collector width is made smaller than Wc. As a result, the distance heretofore restricting the breakdown voltage at the junction becomes the distance A, and improves the breakdown voltage. Additionally, concentration of the electron current near the external collector can be prevented. Moreover, the parasitic emitter-base junction is reduced as compared with conventional one, and the resistance of the link base region is also reduced than conventional one. As a result, high-frequency characteristics are remarkably improved from the conventional technique.

Figure 28:
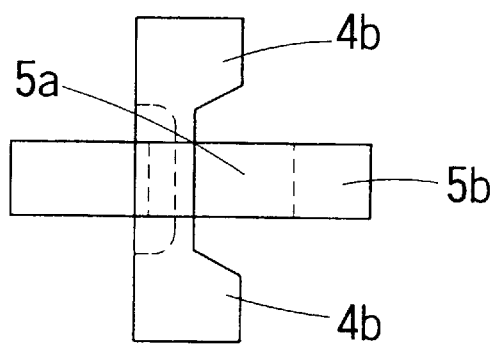

FIG. 28 illustrates another bipolar transistor overcoming the first problem. The transistor shown here employs a rectangular shape as the "first region", i.e. the n−-type collector region, where the first pattern and the second pattern overlap. Then, by shortening the length of the junction between each external base and the collector as far as possible, it diminishes the n−-type collector region changed to the depletion layer and restricts the increase of the collector resistance. Since the parasitic base-collector capacitance is also reduced, high-frequency characteristics such as $f_T$ and $f_{max}$ are also improved. Parasitic base resistance is reduced and high-frequency characteristics are improved by increasing the width of the external base from a location apart from the first region by a predetermined distance and making the link base in self-alignment.

Figure 29:
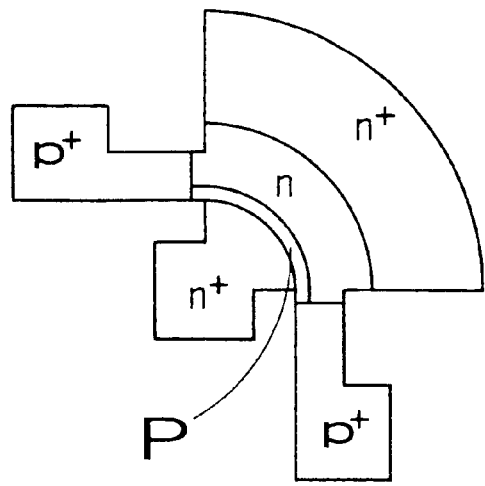
FIG. 29 is a plan view which schematically show a bipolar transistor modified toward a specific purpose according to the invention.

FIG. 29 illustrates another bipolar transistor overcoming the first problem.

Figure 30:
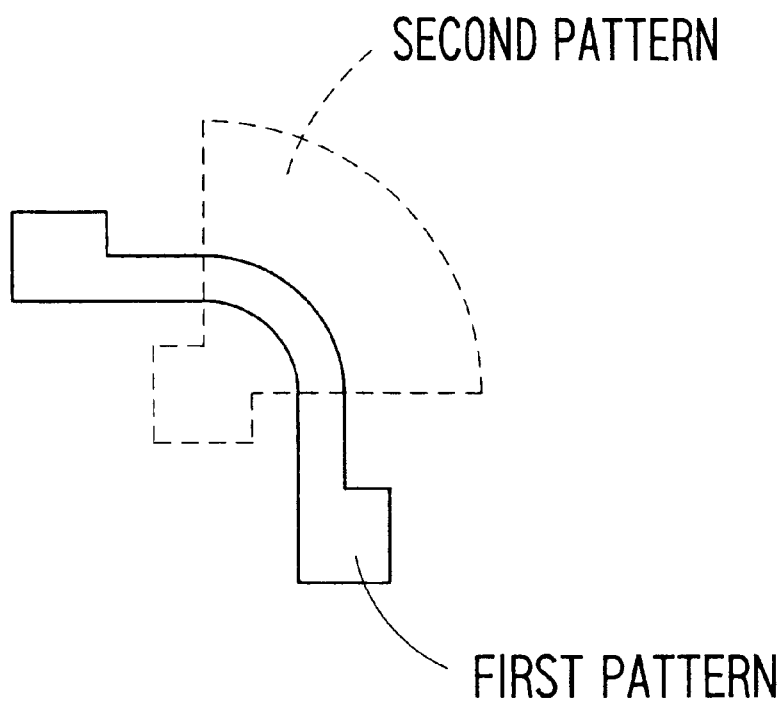
FIG. 30 illustrates the mask patterns used to fabricate the transistor.

FIG. 30 illustrates the mask patterns used to fabricate the transistor.

Figure 31:
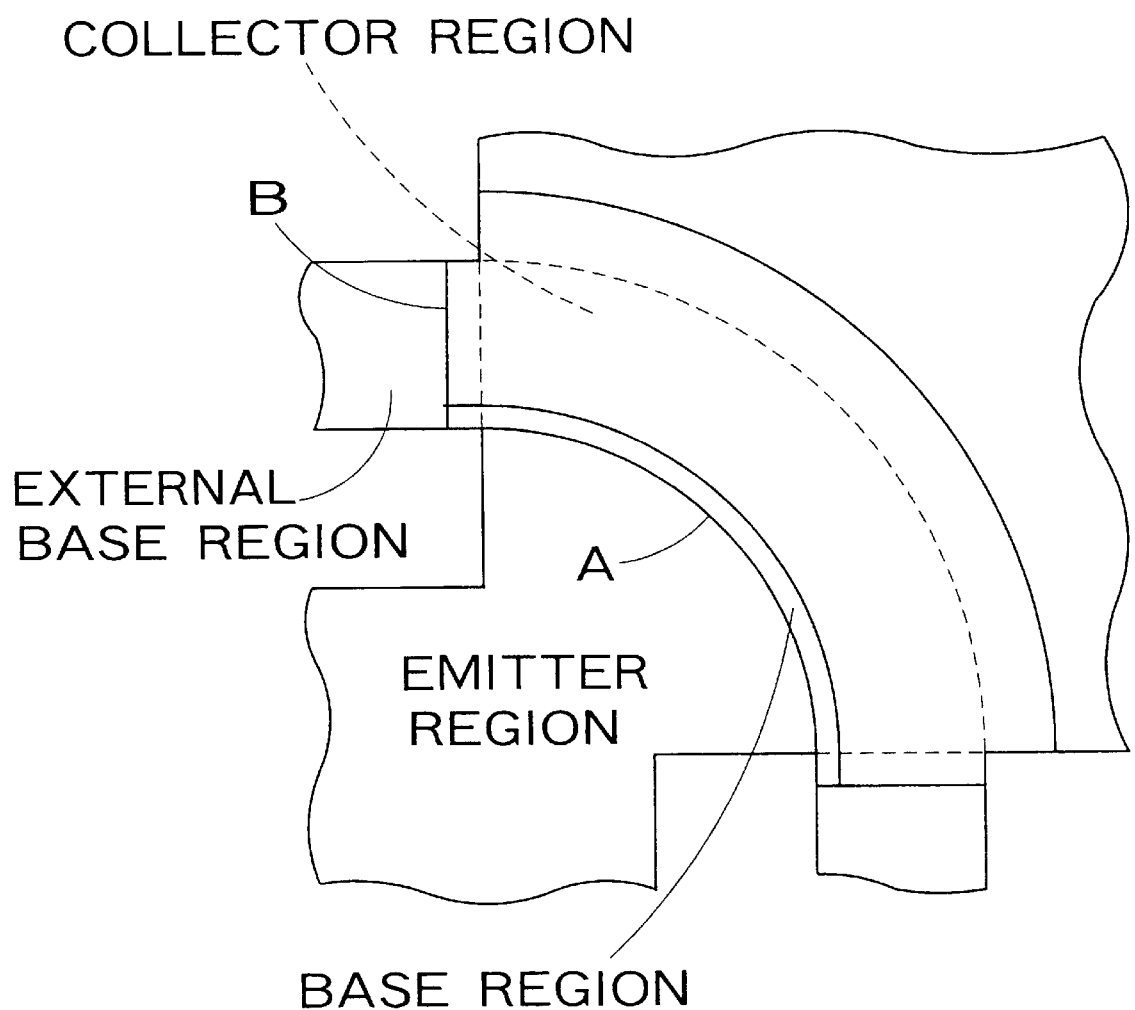
FIG. 31 illustrates the fragmentary enlarged plan view of the central portion of the transistor.

FIG. 31 illustrates the fragmentary enlarged view of the central portion of the transistor. The bipolar transistor shown here employs a substantially L-shaped configuration as the first pattern. Its corner may be either rectangular or ¼-arcuate. the second pattern is so formed that its boundary line normally intersects the first pattern. Therefore, it substantially results in enlarging the width Wc of the n⁻-type collector nearer to the external collector.

Figure 32:
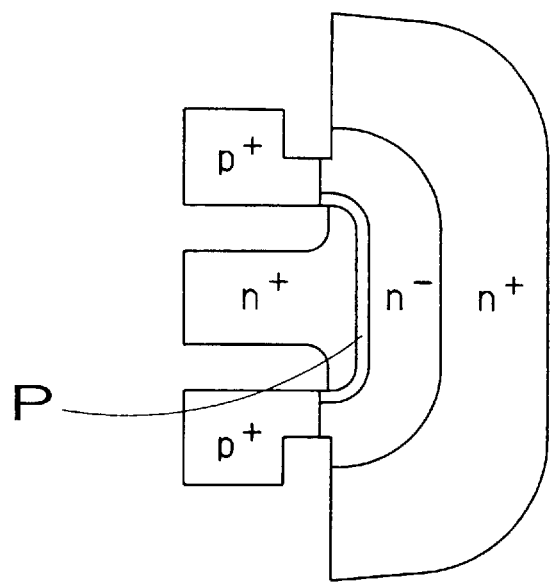
FIG. 32 illustrates a plan view of a bipolar transistor enhancing the features of the structure shown in FIG. 29.

FIG. 32 illustrates a bipolar transistor enhancing the features of the above-shown structure.

Figure 33:
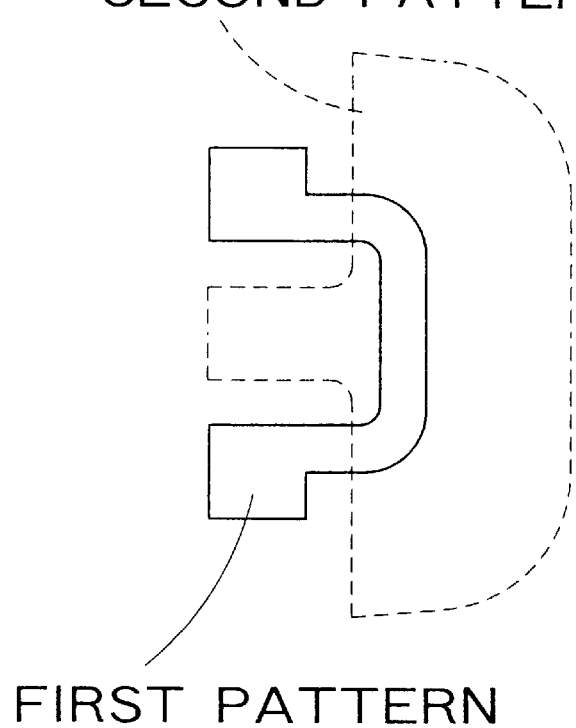
FIG. 33 illustrates the mask patterns used to fabricate the transistor.

FIG. 33 illustrates the mask patterns used to fabricate the transistor.

Figure 34:
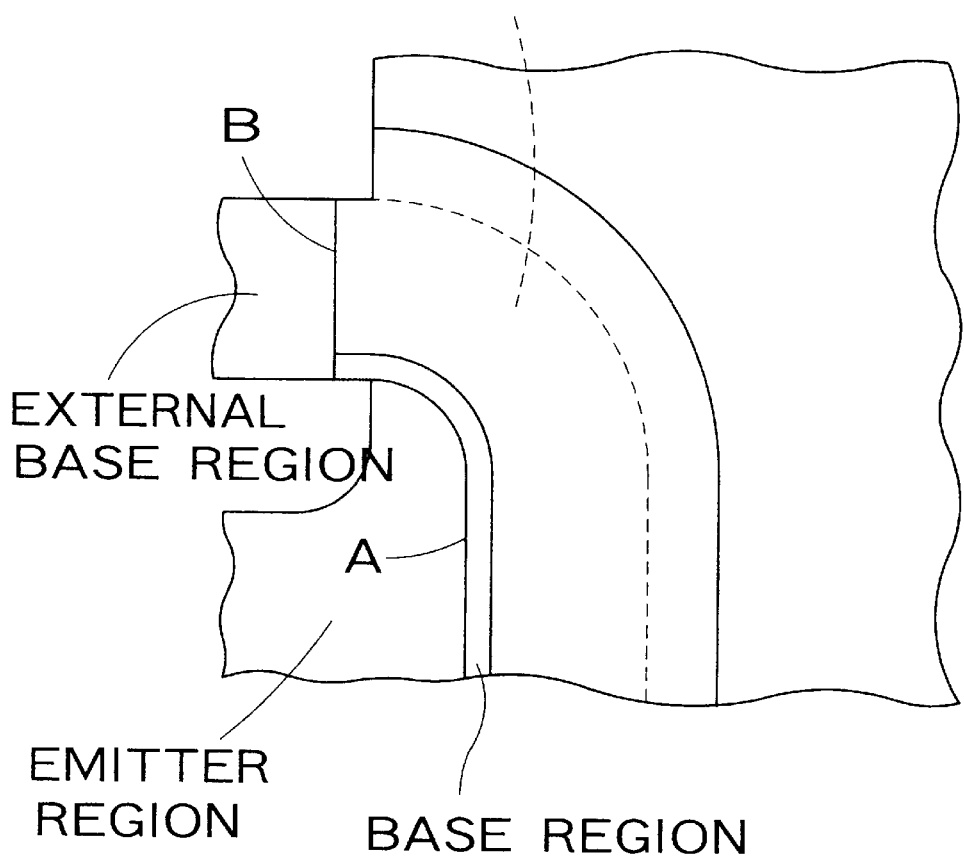
FIG. 34 illustrates the fragmentary enlarged plan view of the central portion of the transistor.
Figure 35:
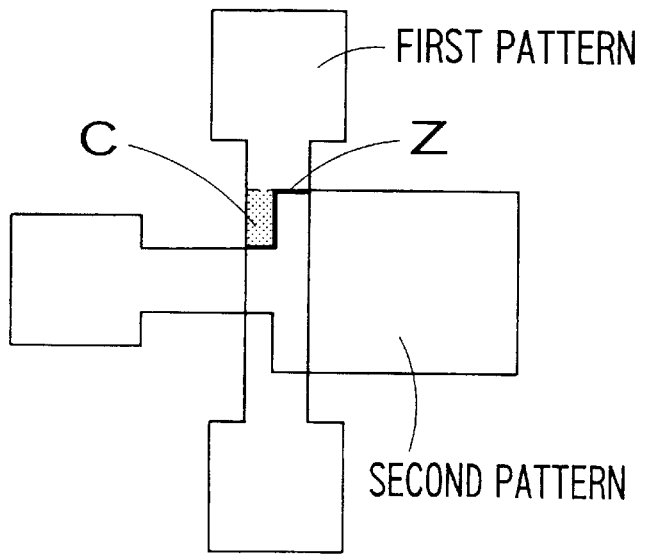
FIG. 35 is a plan view schematically showing a bipolar transistor taken as an comparative example.

FIG. 34 illustrates the fragmentary enlarged view of the central portion of the transistor. The bipolar transistor shown here employs a U-shaped configuration as the first pattern. The second pattern is made as explained above.

In these transistors, the internal base-emitter junction is made along A in FIGS. 31 and 34. The external base-collector junction is made along B in FIGS. 31 and 34. Junctions A and B are not perpendicular of each other. This structure decreases the effect that the electrons flowing out from the junction A are crowded toward the center of the collector region by an electric field normal to the junction B, and concentration of the electron current is alleviated by both the collector region and the base region, thereby to improve the high-frequency characteristics.

Figure 36:
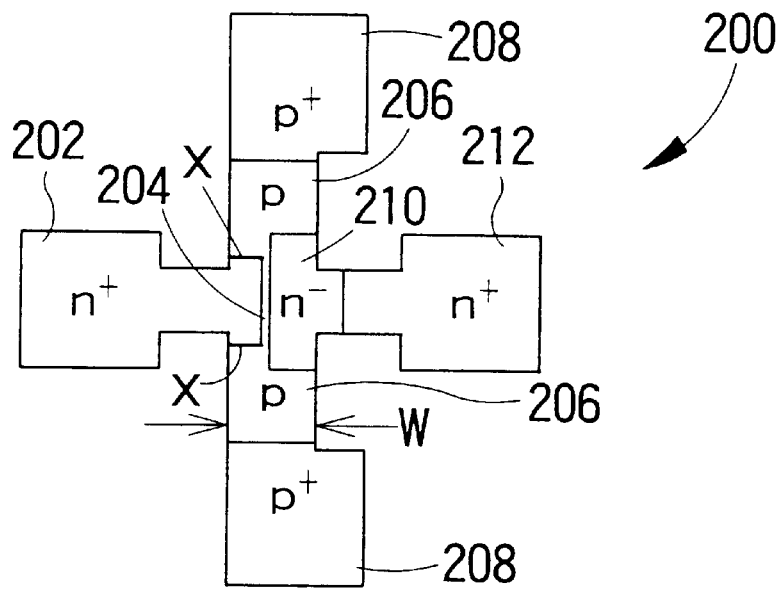
FIG. 36 is a plan view schematically showing construction of a central part of a conventional lateral bipolar transistor.

In the structure shown in FIG. 36, the external base-collector parasitic capacitance shown by Z in the drawing is large. Additionally, the external base region with a narrow width shown by C in the drawing is undesirably produced, and the parasitic base resistance is large accordingly. In this structure, therefore, the first pattern is bent so that first pattern and the second pattern be normal to/perpendicular to from each other at their crossing portion. As a result, the external base-collector parasitic capacitance and the parasitic resistance of each external base are smaller than those of the structure shown in FIG. 36, and high-frequency characteristics can be improved.

In this structure, there may be a problem that emitter-to-base junction area may fluctuate by misalignent of the first and second pattern. To overcome this problem, it is possible to dispose four transistors rotated by 0°, 90°, 180°, 270°, respectively, and connect them in parallel to act as single transistor. In this configuration total emitter-to-base junction area is not changed so much error in the case of misalignment.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No. H10-63671 filed on Mar. 13, 1998, No. H10-65904 filed on Mar. 16, 1998, No. H10-187846 filed on Jul. 2, 1998 and No. H10-364451 filed on Dec. 22, 1998 including specifications, claims, drawings and summarys are incorporated herein by references in its entirety.

What is claimed is:

1. A method for manufacturing a lateral bipolar transistor including an island-shaped semiconductor layer made on an insulating layer to have a predetermined pattern, said semiconductor layer having an emitter region of a second conduction type, a base region of a first conduction type and a collector region of the second conduction type, which are made in close positional relations, and further having an external base region of the first conduction type connected to said base region, comprising:

a collector forming step for forming said collector region by introducing an impurity of the second conduction type into the semiconductor layer made on the insulating layer;

a first masking step for selectively making a first mask on said semiconductor layer;

a junction forming step for making said emitter region and said base region under said first mask by introducing an impurity of the first conduction type and an impurity of the second conduction type into said semiconductor layer outside said first mask and by elevating the temperature to make them diffuse in a lateral direction;

a second masking step for making a second mask on said semiconductor layer to partly overlap said first mask, an external base forming step for making said external base region by introducing an impurity of the first conduction type into said semiconductor layer outside said second mask; and a patterning step for making an island-shaped semiconductor layer having a predetermined pattern by selectively etching said semiconductor layer by using said first mask and said second mask.

2. The method for manufacturing a lateral bipolar transistor according to claim 1 wherein said patterning step includes a step of diminishing said second mask prior to etching said semiconductor layer.

3. The method for manufacturing a lateral bipolar transistor according to claim 2 wherein said second mask made of two stacked mask layers different in material, said step of diminishing said second mask including a step of removing upper one of said two masks after making lower one of said masks to retract by side etching from side surfaces.

4. The method for manufacturing a lateral bipolar transistor according to claim 1 wherein said lateral bipolar transistor further includes an external collector region of the second conduction type connected to said collector region, said method further comprises a step of making a side wall spacer on side surfaces of said first mask, and introducing a impurity of the second conduction type into said semiconductor layer outside thereof to make said external collector region.

5. The method for manufacturing a lateral bipolar transistor according to claim 1 wherein said external base forming step provided side walls on side surfaces of said second mask, and introduces an impurity of the first conduction type into said semiconductor layer outside said side walls to make said external base region.

6. The method for manufacturing a lateral bipolar transistor according to claim 5 wherein said junction forming step includes:

a first step of diffusing an impurity of the first conduction type to form said base region under said first mask by introducing the impurity of the first conduction type into said semiconductor layer outside said first mask and elevating the temperature; and a second step of laterally diffusing the impurity of the second conduction type to make said emitter region under said first mask by making a third mask outside said first mask to cover a part of said semiconductor layer, then introducing the impurity of the second conduction type into said semiconductor layer between said first mask and said third mask, and elevating the temperature.

7. The method for manufacturing a lateral bipolar transistor according to claim 5 wherein said lateral bipolar transistor further includes a base link region of the first conduction type provided between said base region and said external base region to link these regions, said method further comprising a step of making said base link region by ion-implanting an impurity of the first conduction type from a diagonal direction relative to the major surface of said semiconductor layer to introduce the impurity of the first conduction type under said first mask.

8. The method for manufacturing a lateral bipolar transistor according to claim 1 wherein said patterning step includes a step of side-etching said semiconductor layer at edges of said first mask and said second mask to make side surfaces of said semiconductor layer to retract from said edges of said first mask and said second mask.

9. The method for manufacturing a lateral bipolar transistor according to claim 1 wherein said impurity of the first conduction type used in said junction forming step is boron (B) or indium (In), and said impurity of the second conduction type is arsenic (As) or phosphorus (P), said base region and said emitter region being made in a predetermined positional relation by using a difference in diffusion coefficient between the impurity of the first conduction type and the impurity of the second conduction type.

* * * * *